(12) United States Patent
Seong et al.

(10) Patent No.: US 12,432,982 B2
(45) Date of Patent: Sep. 30, 2025

(54) MULTI-CHANNEL TRANSISTOR AND MANUFACTURING METHOD BY THE SAME

(71) Applicant: KOREA UNIVERSITY RESEARCH AND BUSINESS FOUNDATION, Seoul (KR)

(72) Inventors: Tae Yeon Seong, Seoul (KR); Kwang Ro Yun, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 681 days.

(21) Appl. No.: 17/777,692

(22) PCT Filed: Nov. 18, 2020

(86) PCT No.: PCT/KR2020/016261
§ 371 (c)(1),
(2) Date: May 18, 2022

(87) PCT Pub. No.: WO2021/101242
PCT Pub. Date: May 27, 2021

(65) Prior Publication Data
US 2022/0406946 A1 Dec. 22, 2022

(30) Foreign Application Priority Data

Nov. 18, 2019 (KR) .................. 10-2019-0148038
Nov. 17, 2020 (KR) .................. 10-2020-0153705

(51) Int. Cl.
*H10D 30/67* (2025.01)
*H10D 30/01* (2025.01)
*H10D 88/00* (2025.01)

(52) U.S. Cl.
CPC ....... *H10D 30/6757* (2025.01); *H10D 30/031* (2025.01); *H10D 30/6729* (2025.01); *H10D 30/6755* (2025.01); *H10D 88/00* (2025.01)

(58) Field of Classification Search
CPC ............ H10D 30/6757; H10D 30/031; H10D 30/6729; H10D 30/6755; H10D 88/00
See application file for complete search history.

(56) References Cited

U.S. PATENT DOCUMENTS

2005/0167650 A1  8/2005  Orlowski et al.
2007/0257322 A1* 11/2007  Shi ..................... H10D 88/00
                                                      257/E21.442

(Continued)

FOREIGN PATENT DOCUMENTS

KR  10-2015-0055475 A   5/2015
KR  10-2015-0059681 A   6/2015

(Continued)

OTHER PUBLICATIONS

International Search Report mailed Mar. 2, 2021, in connection with International Patent Application No. PCT/KR2020/016261; with English Translation.

(Continued)

*Primary Examiner* — Marlon T Fletcher
*Assistant Examiner* — Christina A Sylvia
(74) *Attorney, Agent, or Firm* — Hauptman Ham, LLP

(57) ABSTRACT

Disclosed are a multilayer-channel thin-film transistor and a method of fabricating the same. More particularly, a multilayer-channel thin-film transistor, including: a first channel layer formed on a substrate; a first source electrode and first drain electrode formed on the first channel layer; a first gate insulating film formed on the first channel layer, the first source electrode and the first drain electrode; a gate electrode formed on the first gate insulating film; a second gate (Continued)

insulating film formed on the gate electrode; a second channel layer formed on the second gate insulating film; and a second source electrode and second drain electrode formed on the second channel layer, wherein the first source electrode and the second source electrode are electrically connected to each other through a source electrode connection part, and the first drain electrode and the second drain electrode are electrically connected to each other through a drain electrode connection part is disclosed.

17 Claims, 20 Drawing Sheets

(56) References Cited

U.S. PATENT DOCUMENTS

| | | | |
|---|---|---|---|
| 2010/0059807 A1 | 3/2010 | Cho et al. | |
| 2016/0225859 A1* | 8/2016 | Takata | H10F 39/189 |
| 2017/0162654 A1* | 6/2017 | Maeda | H10D 30/6757 |
| 2017/0229584 A1* | 8/2017 | Okada | H01L 21/02532 |

FOREIGN PATENT DOCUMENTS

| | | |
|---|---|---|
| KR | 10-2017-0089388 A | 8/2017 |
| KR | 10-2018-0049780 A | 5/2018 |
| WO | 2010/114529 A1 | 10/2010 |

OTHER PUBLICATIONS

Written Opinion mailed Mar. 2, 2021, in connection with International Patent Application No. PCT/KR2020/016261.

* cited by examiner

100

100

200

MULTI-CHANNEL TRANSISTOR AND MANUFACTURING METHOD BY THE SAME

CROSS-REFERENCE TO RELATED APPLICATION

The present application is a national stage filing under 35 U.S.C § 371 of PCT application number PCT/KR2020/016261 filed on Nov. 18, 2020, which is based on and claims priority to Korean Patent Application No. 10-2019-0148038 filed on Nov. 18, 2019, and Korean Patent Application No. 10-2020-0153705 filed on Nov. 17, 2020, in the Korean Intellectual Property Office, which are incorporated herein by reference in their entireties.

TECHNICAL FIELD

The present invention relates to a multilayer-channel thin-film transistor and a method of fabricating the same, and more specifically, to a multilayer-channel thin-film transistor, electrons injected from a source electrode of which are collected in a drain electrode through upper and lower multilayer-channels formed by a gate electrode, so that drain current and mobility are improved; and a method of fabricating the multilayer-channel thin-film transistor.

BACKGROUND ART

A thin-film transistor (TFT) is a type of field-effect transistor fabricated by disposing a semiconductor thin film on an insulating support substrate and includes an active layer providing source and drain electrodes, a channel region, a source region, and a drain region and a gate electrode disposed on the channel region and electrically insulated from the active layer by a gate insulating film.

In a thin-film transistor, when a positive bias stress is continuously applied to a gate electrode, an interface degradation phenomenon between a channel layer and a gate insulating layer may occur. Threshold voltage shift due to such an interface degradation phenomenon causes a decrease in source/drain current, which may result in degradation of display quality.

Therefore, as consumption for large displays and high-definition displays increases, demand for high-performance devices is increasing. In addition, there is a need to develop a technology for a high-performance thin-film transistor having high mobility and high stability.

RELATED ART DOCUMENTS

Patent Documents

Korean Patent Application Publication No. 10-2015-0059681, "THIN-FILM TRANSISTOR HAVING DOUBLE CHANNEL LAYER"

Korean Patent Application Publication No. 10-2015-0055475, "THIN-FILM TRANSISTOR HAVING HIGH ON/OFF CURRENT RATIO"

DISCLOSURE

Technical Problem

Therefore, the present invention has been made in view of the above problems, and it is one object of the present invention to provide a multilayer-channel thin-film transistor and a method of fabricating the same, wherein electrons injected from a first source electrode and a second source electrode are collected in a first drain electrode and second drain electrode through channels of a first channel layer and second channel layer formed by a gate electrode, thereby exhibiting improved drain current and mobility.

It is another object of the present invention to provide a multilayer-channel thin-film transistor and a method of fabricating the same, wherein the multilayer-channel thin-film transistor includes a first channel layer and a second channel layer so that current is separated into and flows into the first channel layer and the second channel layer when voltage is applied, thereby reducing threshold voltage shift and increasing an on-off ratio of the device.

It is still another object of the present invention to provide a multilayer-channel thin-film transistor and a method of fabricating the same, wherein the multilayer-channel thin-film transistor includes a first channel layer and a second channel layer so that current is separated into and flows into the first channel layer and the second channel layer when voltage is applied, thereby improving the stability of the device.

It is still another object of the present invention to provide a multilayer-channel thin-film transistor and a method of fabricating the same, wherein the first source electrode and the second source electrode are connected to a source electrode connection part and the first drain electrode and the second drain electrode are connected to a drain electrode connection part so that the first channel layer and the second channel layer can be simultaneously driven.

It is still another object of the present invention to provide a multilayer-channel thin-film transistor and a method of fabricating the same, wherein the multilayer-channel thin-film transistor includes the first channel layer and the second channel layer and has a dual thin-film transistor structure of being vertically laminated to include the upper gate thin-film transistor and the lower gate thin-film transistor with respect to a gate electrode formed between the first channel layer and the second channel layer, so that two thin-film transistor outputs can be expressed in one thin-film transistor area and, accordingly, a channel layer that is a path through which electrons as main chargers (main carriers) flow can be included in the form of multiple layers, resulting in improvement of drain current and mobility.

It is still another object of the present invention to provide a multilayer-channel thin-film transistor and a method of fabricating the same, wherein the multilayer-channel thin-film transistor includes the first channel layer and the second channel layer and has a dual thin-film transistor structure of being vertically laminated to include the upper gate thin-film transistor and the lower gate thin-film transistor with respect to a gate electrode formed between the first channel layer and the second channel layer, so that an effect of reducing operation voltage movement can be provided.

It is yet another object of the present invention to provide a multilayer-channel thin-film transistor and a method of fabricating the same, wherein the multilayer-channel thin-film transistor includes a second source electrode and second drain electrode formed on a lower multilayer-channel thin-film transistor as a first source electrode and first drain electrode of an upper multilayer-channel thin-film transistor when multilayer-channel thin-film transistors are vertically laminated, so that the degree of integration of the device can be improved and drain current and mobility can be improved, compared to a single multilayer-channel thin-film transistor, due to increased channel layers (3, 4, 5, . . . channel layers).

Technical Solution

In accordance with an aspect of the present invention, the above and other objects can be accomplished by the provision of a multilayer-channel thin-film transistor, including: a first channel layer formed on a substrate; a first source electrode and first drain electrode formed on the first channel layer; a first gate insulating film formed on the first channel layer, the first source electrode and the first drain electrode; a gate electrode formed on the first gate insulating film; a second gate insulating film formed on the gate electrode; a second channel layer formed on the second gate insulating film; and a second source electrode and second drain electrode formed on the second channel layer, wherein the first source electrode and the second source electrode are electrically connected to each other through a source electrode connection part, and the first drain electrode and the second drain electrode are electrically connected to each other through a drain electrode connection part.

The first channel layer and second channel layer of the multilayer-channel thin-film transistor may be simultaneously driven through the source electrode connection part and the drain electrode connection part.

Electrons injected into the first source electrode may be collected in the first drain electrode through the first channel layer by the gate electrode, and electrons injected into the second source electrode may be collected in the second drain electrode through the second channel layer by the gate electrode.

The source electrode connection part and the drain electrode connection part may be formed to pass through the first gate insulating film and second gate insulating film.

The gate electrode may be buried in the second gate insulating film.

The first gate insulating film may have a thickness of 10 nm to 300 nm.

The first channel layer and the second channel layer may include an n-type oxide semiconductor.

At least two or more multilayer-channel thin-film transistors may be laminated to have a three-dimensional structure.

A second source electrode and second drain electrode of a lower multilayer-channel thin-film transistor of the multilayer-channel thin-film transistor having the three-dimensional structure may be driven as a first source electrode and first drain electrode of an upper multilayer-channel thin-film transistor.

In accordance with another aspect of the present invention, there is provided a multilayer-channel thin-film transistor, including: a first source electrode and first drain electrode formed on a substrate; a first channel layer formed on the substrate, the first source electrode and the second drain electrode; a first gate insulating film formed on the first channel layer; a gate electrode formed on the first gate insulating film; a second gate insulating film formed on the gate electrode; a second channel layer formed on the second gate insulating film; and a second source electrode and second drain electrode formed on the second channel layer, wherein the first source electrode and the second source electrode are electrically connected to each other through a source electrode connection part, and the first drain electrode and the second drain electrode are electrically connected to each other through a drain electrode connection part.

The first channel layer and second channel layer of the multilayer-channel thin-film transistor may be simultaneously driven through the source electrode connection part and the drain electrode connection part.

Electrons injected into the first source electrode may be collected in the first drain electrode through the first channel layer by the gate electrode, and electrons injected into the second source electrode may be collected in the second drain electrode through the second channel layer by the gate electrode.

At least two or more multilayer-channel thin-film transistors may be laminated to have a three-dimensional structure.

A second source electrode and second drain electrode of a lower multilayer-channel thin-film transistor of the multilayer-channel thin-film transistor having the three-dimensional structure may be driven as a first source electrode and first drain electrode of an upper multilayer-channel thin-film transistor.

In accordance with another aspect of the present invention, there is provided a method of fabricating a multilayer-channel thin-film transistor, the method including: a step of forming a first channel layer on a substrate; a step of forming a first source electrode and first drain electrode on the first channel layer; a step of forming a first gate insulating film on the first channel layer, the first source electrode and the first drain electrode; a step of forming a gate electrode on the first gate insulating film; a step of forming a second gate insulating film on the first gate insulating film and the gate electrode; a step of forming a second channel layer on the second gate insulating film; a step of respectively forming a source electrode connection part and a drain electrode connection part on the first source electrode and the first drain electrode; a step of forming a second source electrode on the second channel layer to be connected to the source electrode connection part; and a step of forming a second drain electrode on the second channel layer to be connected to the drain electrode connection part.

The step of respectively forming a source electrode connection part and a drain electrode connection part on the first source electrode and the first drain electrode may include a step of forming a first via hole on the first gate insulating film and second gate insulating film formed on the first source electrode; a step of forming a second via hole on the first gate insulating film and second gate insulating film formed on the first drain electrode; and a step of respectively forming a source electrode connection part and a drain electrode connection part inside the first via hole and the second via hole.

In accordance with yet another aspect of the present invention, there is provided a method of fabricating a multilayer-channel thin-film transistor, the method including: a step of forming a first source electrode and first drain electrode on a substrate; a step of forming a first channel layer on the substrate, the first source electrode and the first drain electrode; a step of forming a first gate insulating film on the first channel layer; a step of forming a gate electrode on the first gate insulating film; a step of forming a second gate insulating film on the first gate insulating film and the gate electrode; a step of forming a second channel layer on the second gate insulating film; a step of respectively forming a source electrode connection part and a drain electrode connection part on the first source electrode and the first drain electrode; a step of forming a second source electrode on the second channel layer to be connected to the source electrode connection part; and a step of forming a second drain electrode on the second channel layer to be connected to the drain electrode connection part.

The step of respectively forming a source electrode connection part and a drain electrode connection part on the first source electrode and the first drain electrode may include a step of forming a first via hole on the first gate insulating film and second gate insulating film formed on the first source electrode; a step of forming a second via hole on the first gate insulating film and second gate insulating film formed on the first drain electrode; and a step of respectively forming a source electrode connection part and a drain electrode connection part inside the first via hole and the second via hole.

Advantageous Effects

Embodiments of the present invention can provide a multilayer-channel thin-film transistor and a method of fabricating the same, wherein electrons injected from a first source electrode and a second source electrode are collected in a first drain electrode and second drain electrode through channels of a first channel layer and second channel layer formed by a gate electrode, thereby exhibiting improved drain current and mobility.

Embodiments of the present invention can provide a multilayer-channel thin-film transistor and a method of fabricating the same, wherein the multilayer-channel thin-film transistor includes a first channel layer and a second channel layer so that current is separated into and flows into the first channel layer and the second channel layer when voltage is applied, thereby reducing threshold voltage shift and increasing an on-off ratio of the device.

Embodiments of the present invention can provide a multilayer-channel thin-film transistor and a method of fabricating the same, wherein the multilayer-channel thin-film transistor includes a first channel layer and a second channel layer so that current is separated into and flows into the first channel layer and the second channel layer when voltage is applied, thereby improving the stability of the device.

Embodiments of the present invention can provide a multilayer-channel thin-film transistor and a method of fabricating the same, wherein the first source electrode and the second source electrode are connected to a source electrode connection part and the first drain electrode and the second drain electrode are connected to a drain electrode connection part so that the first channel layer and the second channel layer can be simultaneously driven.

Embodiments of the present invention can provide a multilayer-channel thin-film transistor and a method of fabricating the same, wherein the multilayer-channel thin-film transistor includes the first channel layer and the second channel layer and has a dual thin-film transistor structure of being vertically laminated to include the upper gate thin-film transistor and the lower gate thin-film transistor with respect to a gate electrode formed between the first channel layer and the second channel layer, so that two thin-film transistor outputs can be expressed in one thin-film transistor area and, accordingly, a channel layer that is a path through which electrons as main chargers (main carriers) flow can be included in the form of multiple layers, resulting in improvement of drain current and mobility.

Embodiments of the present invention can provide a multilayer-channel thin-film transistor and a method of fabricating the same, wherein the multilayer-channel thin-film transistor includes the first channel layer and the second channel layer and has a dual thin-film transistor structure of being vertically laminated to include the upper gate thin-film transistor and the lower gate thin-film transistor with respect to a gate electrode formed between the first channel layer and the second channel layer, so that an effect of reducing operation voltage movement can be provided.

Embodiments of the present invention can provide a multilayer-channel thin-film transistor and a method of fabricating the same, wherein the multilayer-channel thin-film transistor includes a second source electrode and second drain electrode formed on a lower multilayer-channel thin-film transistor as a first source electrode and first drain electrode of an upper multilayer-channel thin-film transistor when multilayer-channel thin-film transistors are vertically laminated, so that the degree of integration of the device can be improved and drain current and mobility can be improved, compared to a single multilayer-channel thin-film transistor, due to increased channel layers (3, 4, 5, . . . channel layers).

BEST MODE

Figure 1A:
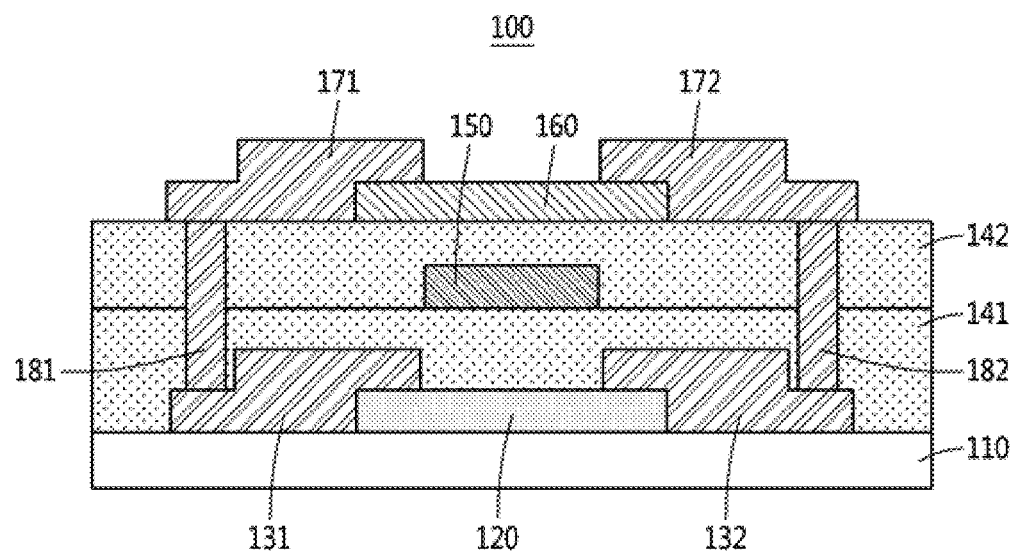
FIG. 1A is a cross-sectional view of a multilayer-channel thin-film transistor according to one embodiment of the present invention.

The present invention will now be described more fully with reference to the accompanying drawings and contents disclosed in the drawings. However, the present invention should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless mentioned otherwise or clearly inferred from context, the expression "x uses a or b" means any one of natural inclusive permutations.

In addition, as used in the description of the disclosure and the appended claims, the singular form "a" or "an" is intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Unless defined otherwise, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

In addition, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

Figure 1B:
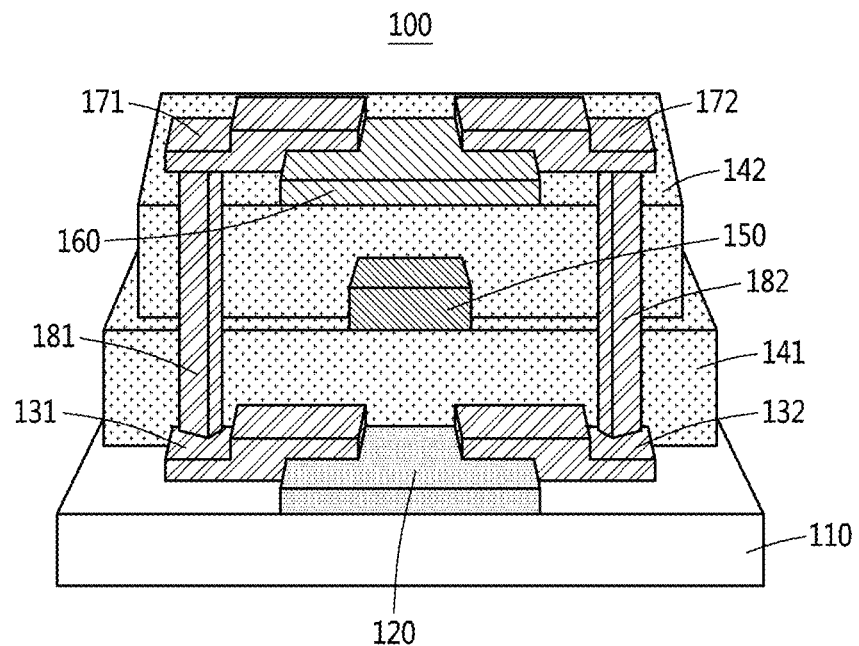
FIG. 1B is a three-dimensional view of a multilayer-channel thin-film transistor according to one embodiment of the present invention.

FIG. 1A is a cross-sectional view of a multilayer-channel thin-film transistor according to one embodiment of the present invention, and FIG. 1B is a three-dimensional view of a multilayer-channel thin-film transistor according to one embodiment of the present invention.

Referring to FIGS. 1A and 1B, a multilayer-channel thin-film transistor 100 according to one embodiment of the present invention includes a first channel layer 120 formed on a substrate 110, a first source electrode 131 and first drain electrode 132 formed on the first channel layer 120, a first gate insulating film 141 formed on the first channel layer 120, the first source electrode 131 and the first drain electrode 132, a gate electrode 150 formed on the first gate insulating film 141, a second gate insulating film 142 formed on the gate electrode 150, a second channel layer 160 formed on the second gate insulating film 142 and a second electrode source 171 and second drain electrode 172 formed on the second channel layer 160.

In addition, the first source electrode 131 and the second source electrode 171 are electrically connected to each other through a source electrode connection part 181, and the first drain electrode 132 and the second drain electrode 172 are electrically connected to each other through a drain electrode connection part 182.

The multilayer-channel thin-film transistor 100 according to one embodiment of the present invention includes the first channel layer 120 formed on the substrate 110.

The substrate 110 is a base substrate for forming a thin-film transistor. A material of the substrate 110 used in this technical field is not particularly limited, but may be, for example, various materials such as silicon, glass, plastic, quartz and metal foil.

According to an embodiment, a plastic substrate may include at least one of glass, a polyimide-based polymer, a polyester-based polymer, a silicone-based polymer, an acrylic polymer, a polyolefin-based polymer, and a copolymer thereof.

According to an embodiment, the substrate 110 may be a flexible substrate having flexibility, and may include at least one of, for example, polyester, polyvinyl, polycarbonate, polyethylene, polyacetate, polyimide, polyethersulphone (PES), polyacrylate (PAR), polyethylene naphthelate (PEN), and polyethylene terephthalate (PET).

As the first channel layer 120, at least one of a p-type oxide semiconductor and an n-type oxide semiconductor may be used. Preferably, an n-type oxide semiconductor may be used as the first channel layer 120.

When an n-type oxide semiconductor is used as the first channel layer 120, current flow may be generated from electrodes (the first source electrode 131 and the second source electrode 171), to which a negative bias is applied, to electrodes (the first drain electrode 132 and the second drain electrode 172) to which a positive bias is applied because main charge transporters causing current flow are electrons.

The first channel layer 120 may include at least one of amorphous-indium gallium zinc oxide (a-IGZO), indium gallium zinc oxide (IGZO), indium zinc oxide (IZO), indium gallium oxide (IGO), indium tin zinc oxide (ITZO), gallium tin oxide (GTO), zinc tin oxide (ZTO), indium antimony zinc oxide (IAZO), antimony zinc oxide (AZO), indium tin oxide (ITO), antimony tin oxide (ATO), and gallium zinc oxide (GZO). Preferably, the first channel layer 120 may include a-IGZO.

Figure 2A:
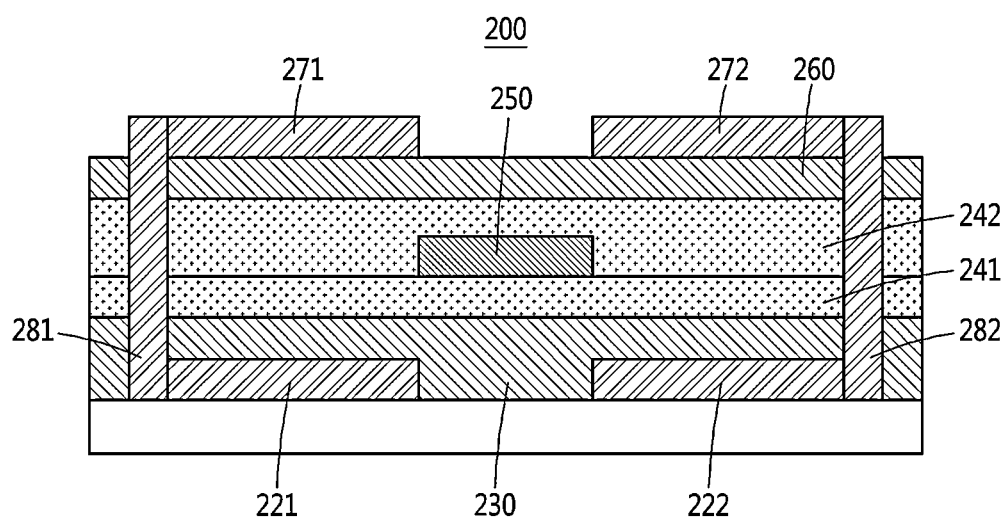
FIG. 2A is a cross-sectional view of a multilayer-channel thin-film transistor according to another embodiment of the present invention.

The first channel layer 120 is patterned on the substrate 110, but, without being limited thereto, may be conformally formed on the substrate 110 as in the first channel layer shown in FIG. 2A.

The multilayer-channel thin-film transistor 100 according to one embodiment of the present invention includes the first source electrode 131 and first drain electrode 132 formed on the first channel layer 120.

A distance between the first source electrode 131 and the first drain electrode 132 may be a channel length, and the distance between the first source electrode 131 and the first drain electrode 132 may be, for example, 5 μm or more, without being particularly limited thereto. When the distance between the first source electrode 131 and the first drain electrode 132 is less than 5 μm, influence due to contact resistance between the first source electrode 131 and first drain electrode 132 and the first channel layer 120 increases, which may cause a performance decrease of the device.

On the other hand, when the distance between the first source electrode 131 and the first drain electrode 132 is too long, there is a problem that a drain current amount is decreased and the area of the device increases.

The first source electrode 131 or the first drain electrode 132 may include a metal or a metal oxide and specifically may include at least one of a low-resistance metal such as aluminum (Al), an aluminum alloy (Al alloy), tungsten (W), copper (Cu), nickel (Ni), chromium (Cr), molybdenum (Mo), titanium (Ti), platinum (Pt), tantalum (Ta), gold (Au) or silver (Ag) and a transparent metal oxide such as indium tin oxide (ITO), indium zinc oxide (IZO) or indium tin zinc oxide (ITZO).

The multilayer-channel thin-film transistor 100 according to one embodiment of the present invention includes the first channel layer 120 and the first gate insulating film 141 formed on the first source electrode 131 and the first drain electrode 132.

The thickness of the first gate insulating film 141 may be several tens of nm to several hundreds of nm, preferably, 10 nm to 300 nm. When the thickness of the first gate insulating film 141 is less than 10 nm, there is a problem that insulating characteristics are low and thus current leakage increases. When the thickness of the first gate insulating film 141 exceeds 300 nm, there is a problem that the amount of current of the device is decreased (the capacitance of insulating film is inversely proportional to a drain current value) because the capacitance of the first gate insulating film 141 is decreased (the capacitance of insulating film is inversely proportional to the thickness of insulating film).

More preferably, the thickness of the first gate insulating film 141 may be 50 nm.

The first gate insulating film 141 may be included in the form of a single film or multilayer film composed of an organic insulating film or an inorganic insulating film or in the form of an organic-inorganic hybrid layer.

As the organic insulating film, at least one of polymethylmethacrylate (PMMA), polystyrene (PS), polyvinyl alcohol (PVA), polyvinylpyrrolidone (PVP), a phenolic polymer, an acrylic polymer, an imide-based polymer such as polyimide, an arylether-based polymer, an amide-based polymer, a fluorine-based polymer, a p-xylylene-based polymer, a vinyl alcohol-based polymer and parylene may be included. As the inorganic insulating film, at least one of a silicon oxide film, a silicon nitride film, an aluminum oxide film ($Al_2O_3$), a tantalum oxide film ($Ta_2O_5$), yttrium oxide ($Y_2O_3$), zirconium oxide (ZrOx), titanium oxide (TiOx), hafnium oxide (HfOx), zirconium aluminum oxide (ZrAlOx), BST and PZT may be included.

The multilayer-channel thin-film transistor 100 according to one embodiment of the present invention includes the gate electrode 150 formed on the first gate insulating film 141.

The gate electrode 150 may be buried in the second gate insulating film 142.

The gate electrode 150 may include a metal or metal oxide that is an electrically conductive material. Specifically, the gate electrode 150 may include at least one material of a metal, such as molybdenum (Mo), aluminum (Al), chromium (Cr), gold (Au), titanium (Ti) or silver (Ag), and a metal oxide such as indium tin oxide (ITO), indium zinc oxide (IZO) or indium tin zinc oxide (ITZO).

According to an embodiment, the gate electrode 150 may be formed of a p+-Si material.

The multilayer-channel thin-film transistor 100 according to one embodiment of the present invention includes the second gate insulating film 142 formed on the gate electrode 150.

The thickness of the second gate insulating film 142 may be several tens of nm to several hundreds of nm, preferably 10 nm to 300 nm. When the thickness of the second gate insulating film 142 is less than 10 nm, there is a problem that insulating characteristics are low and thus current leakage is increased. When the thickness of the second gate insulating film 142 exceeds 300 nm, there is a problem that the amount of current of the device is decreased (the capacitance of insulating film is inversely proportional to a drain current value) because the capacitance of the second gate insulating film 142 is decreased (the capacitance of insulating film is inversely proportional to the thickness of the insulating film).

More preferably, the thickness of the second gate insulating film 142 may be 50 nm.

The second gate insulating film 142 may be included in the form of a single film or multilayer film composed of an organic insulating film or an inorganic insulating film, or in the form of an organic-inorganic hybrid layer.

As the organic insulating film, at least one of polymethylmethacrylate (PMMA), polystyrene (PS), a phenolic polymer, an acrylic polymer, an imide-based polymer such as polyimide, an arylether-based polymer, an amide-based polymer, a fluorine-based polymer, a p-xylylene-based polymer, a vinyl alcohol-based polymer and parylene may be included. As the inorganic insulating film, at least one of a silicon oxide film, a silicon nitride film, an aluminum oxide film ($Al_2O_3$), a tantalum oxide film ($Ta_2O_5$), yttrium oxide ($Y_2O_3$), zirconium oxide (ZrOx), hafnium oxide (HfOx), zirconium aluminum oxide (ZrAlOx), BST and PZT may be included.

The multilayer-channel thin-film transistor 100 according to one embodiment of the present invention includes the second channel layer 160 formed on the second gate insulating film 142.

Accordingly, since the multilayer-channel thin-film transistor 100 according to one embodiment of the present invention includes the first channel layer 120 and the second channel layer 160, current is separated and flows into the first channel layer 120 and the second channel layer 160 when voltage is applied, so that threshold voltage shift may be reduced and an on-off ratio of the device may be increased.

In addition, since the multilayer-channel thin-film transistor 100 according to one embodiment of the present invention includes the first channel layer 120 and the second channel layer 160, when voltage is applied, current is separated and flows into the first channel layer 120 and the second channel layer 160 so that the stability of the device may be improved.

In addition, the multilayer-channel thin-film transistor 100 according to one embodiment of the present invention includes the first channel layer 120 and the second channel layer 160 and has a dual thin-film transistor structure of being vertically laminated to include an upper gate thin-film transistor and a lower gate thin-film transistor based on the gate electrode 150 formed between the first channel layer 120 and the second channel layer 160, so that two thin-film transistor outputs may be expressed in one thin-film transistor area and, accordingly, a channel layer that is a path through which electrons as main chargers (main carriers) flow may be included in the form of multiple layers, resulting in improvement of drain current and mobility.

Further, the multilayer-channel thin-film transistor 100 according to one embodiment of the present invention may include the first channel layer 120 and the second channel layer 160 and may has a dual thin-film transistor structure of being vertically laminated to include the upper gate thin-film transistor and the lower gate thin-film transistor based on the gate electrode 150 formed between the first channel layer 120 and the second channel layer 160, so that an effect of reducing operation voltage movement may be exhibited.

More specifically, the multilayer-channel thin-film transistor 100 according to one embodiment of the present invention may be formed by vertically laminating the lower gate thin-film transistor including the first channel layer 120, the first source electrode 131 and first drain electrode 132 formed on the first channel layer 120, the first gate insulating film 141 formed on the first channel layer 120, the first source electrode 131 and the first drain electrode 132, and the gate electrode 150 formed on the first gate insulating film 141; and the upper gate thin-film transistor including the gate electrode 150, the second gate insulating film 142 formed on the gate electrode 150, the second channel layer 160 formed on the second gate insulating film 142, and the second electrode source 171 and second drain electrode 172 formed on the second channel layer 160 to be connected to each other in parallel with respect to the gate electrode 150, so that the multilayer-channel thin-film transistor 100 may receive output from the two thin-film transistors (the first channel layer 120 and the second channel layer 160) and, accordingly, the output of two transistors may be exhibited in the area of a single thin-film transistor. Accordingly, drain current and mobility may be improved, and an effect of reducing operation voltage movement may be exhibited.

As the second channel layer 160, at least one of a p-type oxide semiconductor and an n-type oxide semiconductor may be used. Preferably, an n-type oxide semiconductor may be used as the second channel layer 160.

When an n-type oxide semiconductor is used as the second channel layer 160, a current flows from the electrodes (the first source electrode 131 and the second source electrode 171) to which a negative bias is applied to the electrodes (the first drain electrode 132 and the second drain electrode 172) to which a positive bias is applied because a main charge transporter causing current flow are electrons.

Accordingly, since the multilayer-channel thin-film transistor 100 according to one embodiment of the present invention uses both the first channel layer 120 and the second channel layer 160 as an n-type oxide semiconductor and thus a main charge transporter causing current flow is electrons, a current flows from the electrodes (the first source electrode 131 and the second source electrode 171) to which a negative bias is applied to the electrodes (the first drain electrode 132 and the second drain electrode 170) to which a positive bias is applied.

The second channel layer 160 may include at least one of amorphous-indium gallium zinc oxide (a-IGZO), indium gallium zinc oxide (IGZO), indium zinc oxide (IZO), indium gallium oxide (IGO), indium tin zinc oxide (ITZO), gallium tin oxide (GTO), zinc tin oxide (ZTO), indium antimony zinc oxide (IAZO), antimony zinc oxide (AZO), indium tin oxide (ITO), antimony tin oxide (ATO), and gallium zinc oxide (GZO). Preferably, the first channel layer 120 may include a-IGZO.

The second channel layer 160 is patterned on the substrate 110, but, without being limited thereto, may be conformally formed on the substrate 110 as in the second channel layer shown in FIG. 2A.

The multilayer-channel thin-film transistor 100 according to one embodiment of the present invention includes the second source electrode 171 and second drain electrode 172 formed on the second channel layer 160.

A distance between the second source electrode 171 and the second drain electrode 172 may be a channel length, and the distance between the second source electrode 171 and the second drain electrode 172 may be, for example, 5 μm or more, without being particularly limited thereto. When the distance between the second source electrode 171 and the second drain electrode 172 is less than 5 μm, influence due to contact resistance between the second source electrode 171 and second drain electrode 172 and the first channel layer 120 increases, which may cause a performance decrease of the device.

On the other hand, when the distance between the second source electrode 171 and the second drain electrode 172 is too long, there is a problem that a drain current amount is decreased and the area of the device increases.

A distance between the first source electrode 131 and the first drain electrode 132 may be equal to or different from a distance between the second source electrode 171 and the second drain electrode 172.

The second source electrode 171 or the second drain electrode 172 may include a metal or a metal oxide and specifically may include at least one material of a metal such as a metal such as molybdenum (Mo), aluminum (Al), chromium (Cr), gold (Au), titanium (Ti) or silver (Ag) and a metal oxide such as indium tin oxide (ITO), indium zinc oxide (IZO) or indium tin zinc oxide (ITZO).

The multilayer-channel thin-film transistor 100 according to one embodiment of the present invention includes the source electrode connection part 181 for electrically connecting the first source electrode 131 and the second source electrode 171 to each other; and the drain electrode connection part 182 for electrically connecting the first drain electrode 132 and the second drain electrode 172 to each other.

That is, the source electrode connection part 181 and the drain electrode connection part 182 may be formed to pass through the first gate insulating film 141 and the second gate insulating film 142 so that the source electrode connection part 181 and the drain electrode connection part 182 electrically connect the upper and lower source electrode and drain electrode to each other.

Accordingly, in the case of the multilayer-channel thin-film transistor 100 according to one embodiment of the present invention, the first channel layer 120 and the second channel layer 160 may be simultaneously driven through the source electrode connection part 181 and the drain electrode connection part 182, thereby improving drain current and mobility.

More specifically, electrons injected into the first source electrode 131 may be collected in the first drain electrode 132 through the first channel layer 120 by the gate electrode 150, and electrons injected into the second source electrode 171 may be collected in the second drain electrode 172 through the second channel layer 160 by the gate electrode 150, thereby improving drain current and mobility.

The source electrode connection part 181 may include a material the same as or different from that of the first source electrode 131 and the second source electrode 171, and the source electrode connection part 181 may include a metal or a metal oxide and specifically, may include at least one material of a metal, such as molybdenum (Mo), aluminum (Al), chromium (Cr), gold (Au), titanium (Ti) or silver (Ag), and a metal oxide such as indium tin oxide (ITO), indium zinc oxide (IZO) or indium tin zinc oxide (ITZO).

The drain electrode connection part 182 may include a material the same as or different from that of the first drain electrode 132 and the second drain electrode 172, and the drain electrode connection part 182 may include a metal or a metal oxide and specifically, may include at least one material of a metal, such as molybdenum (Mo), aluminum (Al), chromium (Cr), gold (Au), titanium (Ti) or silver (Ag), and a metal oxide such as indium tin oxide (ITO), indium zinc oxide (IZO) or indium tin zinc oxide (ITZO).

Figure 1C:
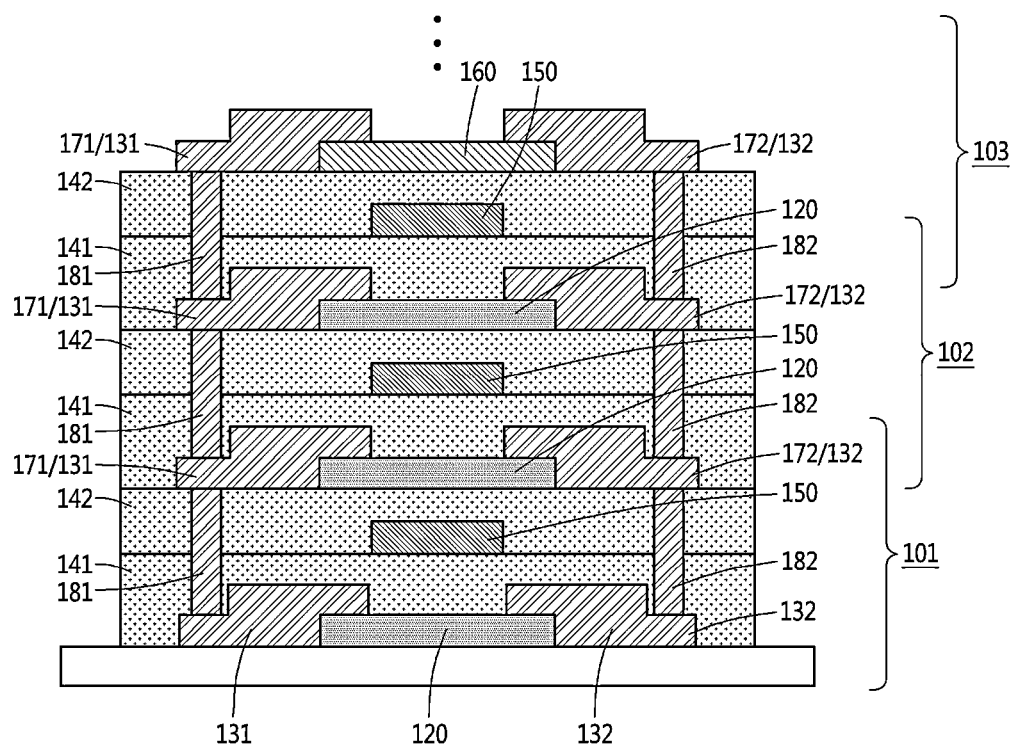
FIG. 1C is structure of a multilayer-channel thin-film transistor according to one embodiment of the present invention.

FIG. 1C is a cross-sectional view of the three-dimensional structure of a multilayer-channel thin-film transistor according to one embodiment of the present invention.

At least two multilayer-channel thin-film transistors 101, 102 and 103 according to one embodiment of the present invention are laminated to have a three-dimensional structure.

More specifically, a multilayer-channel thin-film transistor 100 according to one embodiment of the present invention includes a second source electrode 171 and second drain electrode 172 formed on a lower multilayer-channel thin-film transistor as a first source electrode 131 and first drain electrode 132 of an upper multilayer-channel thin-film transistor when multilayer-channel thin-film transistors are vertically laminated, so that the degree of integration of the device may be improved and drain current and mobility may be improved, compared to a single multilayer-channel thin-film transistor, due to increased channel layers (3, 4, 5, . . . channel layers).

For example, referring to FIG. 1C, the multilayer-channel thin-film transistor according to one embodiment of the present invention having a three-dimensional structure may include the first multilayer-channel thin-film transistor 101, the second multilayer-channel thin-film transistor 102 and the third multilayer-channel thin-film transistor 103.

The second source electrode 171 and second drain electrode 172 of the first multilayer-channel thin-film transistor 101 may be used as the first source electrode 131 and first drain electrode 132 of the second multilayer-channel thin-film transistor 102 laminated on the first multilayer-channel thin-film transistor 101, and the second source electrode 171 and second drain electrode 172 of the second multilayer-channel thin-film transistor 102 may be used as the first source electrode 131 and first drain electrode 132 of the third multilayer-channel thin-film transistor 103 laminated on the second multilayer-channel thin-film transistor 102.

Accordingly, the second source electrode 171 and second drain electrode 172 of the lower multilayer-channel thin-film transistor of the multilayer-channel thin-film transistor according to one embodiment of the present invention having a three-dimensional structure may be driven as the first source electrode 131 and first drain electrode 132 of the upper multilayer-channel thin-film transistor, and the source electrode connection part 181 and drain electrode connection part 182 of the first multilayer-channel thin-film transistor 101, the second multilayer-channel thin-film transistor 102 and the third multilayer-channel thin-film transistor 103 may be electrically connected to each other.

Accordingly, the multilayer-channel thin-film transistor according to one embodiment of the present invention having a three-dimensional structure may improve the degree of integration of the device and provide improved mobility, compared to a single multilayer-channel thin-film transistor, due to increased channel layers (3, 4, 5, . . . channel layers).

Figure 2B:
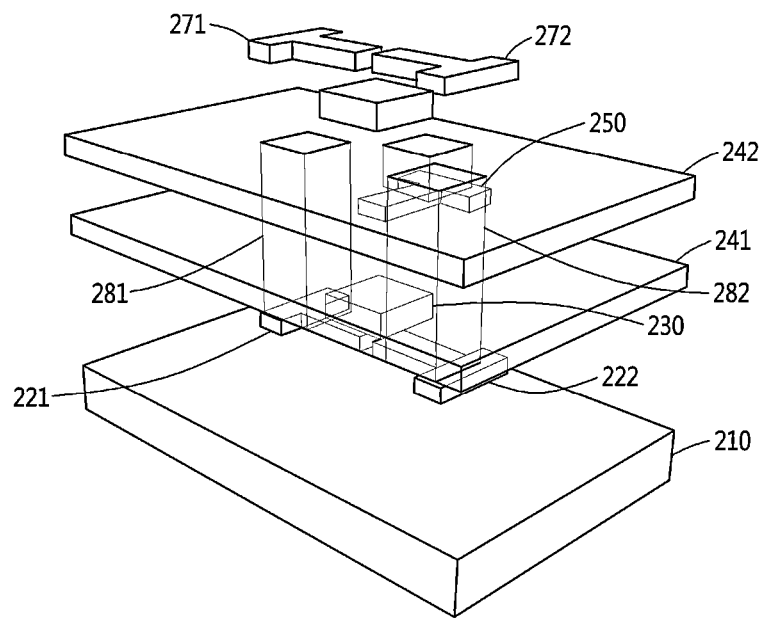
FIG. 2B is a three-dimensional view of a multilayer-channel thin-film transistor according to another embodiment of the present invention.

FIG. 2A is a cross-sectional view of a multilayer-channel thin-film transistor according to another embodiment of the present invention, and FIG. 2B is a three-dimensional view of a multilayer-channel thin-film transistor according to another embodiment of the present invention.

The multilayer-channel thin-film transistor according to another embodiment of the present invention includes the same components as the multilayer-channel thin-film transistor according to an embodiment of the present invention except that the locations of a first channel layer 230, first source electrode 221 and first drain electrode 222 are different. Therefore, detailed description of the same components is omitted.

Referring to FIGS. 2A and 2B, a multilayer-channel thin-film transistor 200 according to another embodiment of the present invention includes a first source electrode 221 and first drain electrode formed on a substrate 210, a first channel layer 230 formed on the substrate 210, the first source electrode 221 and the first drain electrode 222, a first gate insulating film 241 formed on the first channel layer 230, a gate electrode 250 formed on the first gate insulating film 241, a second gate insulating film 242 formed on the gate electrode 250, a second channel layer 260 formed on the second gate insulating film 242, and a second source electrode 271 and second drain electrode 272 formed on the second channel layer 260.

Accordingly, in the case of the multilayer-channel thin-film transistor 200 according to another embodiment of the present invention, the first channel layer 230 and the second channel layer 260 may be simultaneously driven through a source electrode connection part 281 and a drain electrode connection part 282, thereby improving drain current and mobility.

More specifically, electrons injected into the first source electrode 221 may be collected in the first drain electrode 222 through the first channel layer 230 by the gate electrode 250, and electrons injected into the second source electrode 271 may be collected in the second drain electrode 272 through the second channel layer 260 by the gate electrode 250, thereby improving drain current and mobility.

The first channel layer 230 or the second channel layer 260 is conformally formed on the substrate 110, but, without being limited thereto, may be formed the substrate 110 as in the first channel layer or the second channel layer shown in FIG. 1A.

In addition, the multilayer-channel thin-film transistor 200 according to another embodiment of the present invention uses an n-type oxide semiconductor as the first channel layer 230 and the second channel layer 260, so that current flow may be generated from electrodes (the first source electrode 221 and the second source electrode 272), to which a negative bias is applied, to electrodes (the first drain electrode 222 and the second drain electrode 272) to which a positive bias is applied because main charge transporters causing current flow are electrons.

In addition, the first source electrode 221 and second source electrode 271 of the multilayer-channel thin-film transistor 200 according to another embodiment of the present invention may be electrically connected to each other through the source electrode connection part 281, and the first drain electrode 222 and the second drain electrode 272 may be electrically connected to each other through the drain electrode connection part 282.

Accordingly, in the case of the multilayer-channel thin-film transistor 200 according to another embodiment of the present invention, the first channel layer 230 and the second channel layer 260 may be simultaneously driven through the source electrode connection part 281 and the drain electrode connection part 282, thereby improving drain current and mobility.

More specifically, electrons injected into the first source electrode 131 may be collected in the first drain electrode 222 through the first channel layer 230 by the gate electrode 250, and electrons injected into the second source electrode 271 may be collected in the second drain electrode 172 through the second channel layer 260 by the gate electrode 250, thereby improving drain current and mobility.

In addition, the multilayer-channel thin-film transistor according to another embodiment of the present invention may be formed by vertically laminating the lower gate thin-film transistor including the first source electrode 221 and the first drain electrode, the first channel layer 230 formed on the substrate 210, the first source electrode 221 and the first drain electrode 222, the first gate insulating film 241 formed on the first channel layer 230 and the gate electrode 250 formed on the first gate insulating film 241; and the upper gate thin-film transistor including the gate electrode 250, the second gate insulating film 242 formed on the gate electrode 250, the second channel layer 260 formed on the second gate insulating film 242, and the second source electrode and second drain electrode 272 formed on the second channel layer 260 to be connected to each other in parallel with respect to gate electrode, so that the multilayer-channel thin-film transistor may receive output from the two thin-film transistors (the first channel layer 120 and the second channel layer 160) and, accordingly, the output of two transistors may be exhibited in the area of a single thin-film transistor. Accordingly, drain current and mobility may be improved, and an effect of reducing operation voltage movement may be exhibited.

Figure 2C:
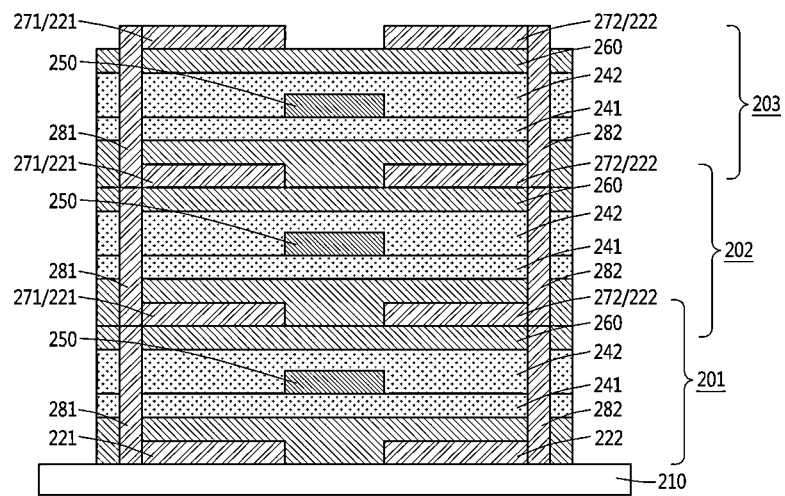
FIG. 2C is a cross-sectional view of the three-dimensional structure of a multilayer-channel thin-film transistor according to another embodiment of the present invention.

FIG. 2C is a cross-sectional view of the three-dimensional structure of a multilayer-channel thin-film transistor according to another embodiment of the present invention.

At least two multilayer-channel thin-film transistors 201, 202 and 203 according to another embodiment of the present invention are laminated to have a three-dimensional structure.

In addition, the multilayer-channel thin-film transistors 201, 202 and 203 according to one embodiment of the present invention include a second source electrode 271 and second drain electrode 272 formed on a lower multilayer-channel thin-film transistor as a first source electrode 221 and first drain electrode 222 of an upper multilayer-channel thin-film transistor when vertically laminated, so that the degree of integration of the device may be improved and drain current and mobility may be improved, compared to a single multilayer-channel thin-film transistor, due to increased channel layers (3, 4, 5, . . . channel layers).

For example, referring to FIG. 2C, the multilayer-channel thin-film transistor according to another embodiment of the present invention having a three-dimensional structure may include the first multilayer-channel thin-film transistor 201, the second multilayer-channel thin-film transistor 202 and the third multilayer-channel thin-film transistor 203.

The second source electrode 271 and second drain electrode 272 of the first multilayer-channel thin-film transistor 201 may be used as the first source electrode 221 and first drain electrode 222 of the second multilayer-channel thin-film transistor 202 laminated on the first multilayer-channel thin-film transistor 201, and the second source electrode 271 and second drain electrode 272 of the second multilayer-channel thin-film transistor 202 may be used as the first source electrode 221 and first drain electrode 222 of the third multilayer-channel thin-film transistor 203 laminated on the second multilayer-channel thin-film transistor 202.

Accordingly, the second source electrode 271 and second drain electrode 272 of the lower multilayer-channel thin-film transistor of the multilayer-channel thin-film transistor according to another embodiment of the present invention having a three-dimensional structure may be driven as the first source electrode 231 and first drain electrode 232 of the upper multilayer-channel thin-film transistor, and the source electrode connection part 281 and drain electrode connection part 182 of the first multilayer-channel thin-film transistor 201, the second multilayer-channel thin-film transistor 202 and the third multilayer-channel thin-film transistor 203 may be electrically connected to each other, thereby improving the degree of integration of the device and providing improved mobility, compared to a single multilayer-channel thin-film transistor, due to increased channel layers (3, 4, 5, . . . channel layers).

Figure 3:
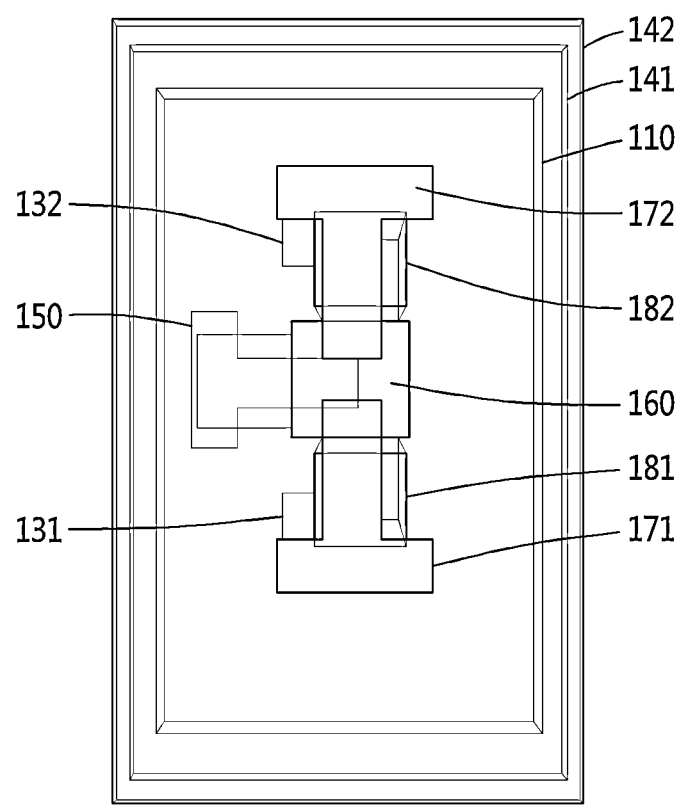
FIG. 3 is a top view of a multilayer-channel thin-film transistor according to one embodiment of the present invention.

FIG. 3 is a top view of a multilayer-channel thin-film transistor according to one embodiment of the present invention.

Referring to FIG. 3, in the multilayer-channel thin-film transistor according to one embodiment of the present invention, the first source electrode 131, the first drain electrode 132, the second source electrode 171 and the second drain electrode 172 are formed in a direction perpendicular to the gate electrode 150, and the first source electrode 131 and the first drain electrode 132 are formed to be parallel to the second source electrode 171 and the second drain electrode 172, thereby being respectively and electrically connected to the source electrode connection part 181 and the drain electrode connection part 182.

Figure 4:
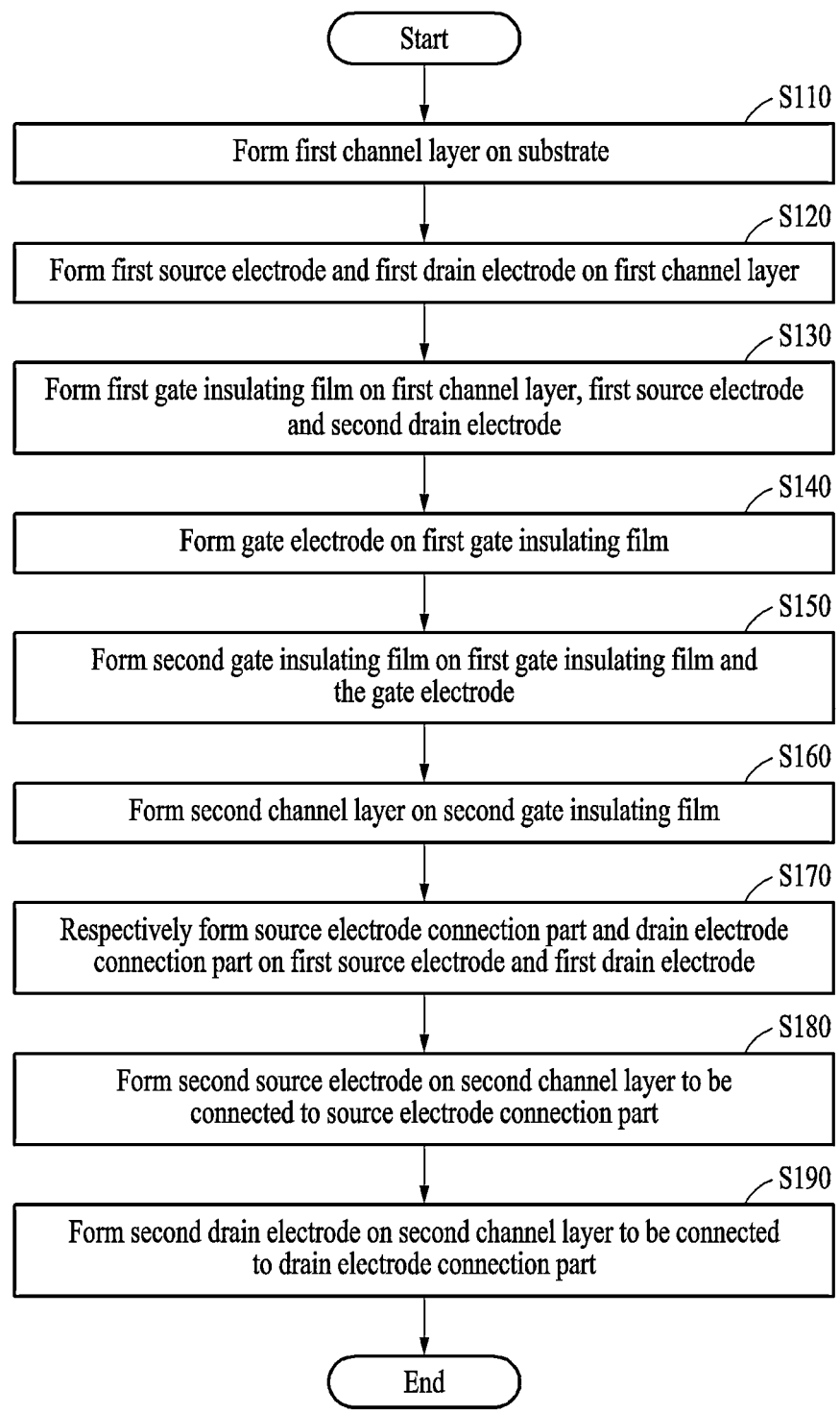
FIG. 4 is a flowchart for explaining a method of fabricating a multilayer-channel thin-film transistor according to one embodiment of the present invention.

FIG. 4 is a flowchart for explaining a method of fabricating a multilayer-channel thin-film transistor according to one embodiment of the present invention.

The method of fabricating a multilayer-channel thin-film transistor according to one embodiment of the present invention includes the same components as those of the multilayer-channel thin-film transistor according to one embodiment of the present invention. Accordingly, detailed description of the same components is omitted.

The method of fabricating a multilayer-channel thin-film transistor according to one embodiment of the present invention includes a step (S110) of forming a first channel layer on a substrate, a step (S120) of forming a first source electrode and first drain electrode on the first channel layer, a step (S130) of forming a first gate insulating film on the first channel layer, the first source electrode and the first drain electrode, a step (S140) of forming a gate electrode on the first gate insulating film, a step (S150) of forming a second gate insulating film on the first gate insulating film and the gate electrode, a step (S160) of forming a second channel layer on the second gate insulating film, a step (S170) of respectively forming a source electrode connection part and a drain electrode connection part on the first source electrode and the first drain electrode, a step (S180) of forming a second source electrode on the second channel layer to be connected to the source electrode connection part, and a step (S190) of forming a second drain electrode on the second channel layer to be connected to the drain electrode connection part.

Accordingly, a multilayer-channel thin-film transistor fabricated by the method of fabricating a multilayer-channel thin-film transistor according to one embodiment of the present invention may include a first channel layer and a second channel layer so that current is separated into and flows into the first channel layer and the second channel layer when voltage is applied, thereby reducing threshold voltage shift and increasing an on-off ratio of the device.

In addition, the multilayer-channel thin-film transistor fabricated by the method of fabricating a multilayer-channel thin-film transistor according to one embodiment of the present invention may include the first channel layer and the second channel layer, so that current is separated into and flows into the first channel layer and the second channel layer when voltage is applied, thereby improving the stability of the device.

In addition, the multilayer-channel thin-film transistor fabricated by the method of fabricating a multilayer-channel thin-film transistor according to one embodiment of the present invention may be formed by vertically laminating a lower gate thin-film transistor including a first channel layer, a first source electrode and first drain electrode formed on the first channel layer, a first gate insulating film formed on the first channel layer, the first source electrode and first drain electrode, and a gate electrode formed on the first gate insulating film; and an upper gate thin-film transistor including a gate electrode, a second gate insulating film formed on the gate electrode, a second channel layer formed on the second gate insulating film, and a second source electrode and second drain electrode formed on the second channel layer to be connected to each other in parallel with respect to gate electrode, so that the multilayer-channel thin-film transistor may receive output from the two thin-film transistors (the first channel layer and the second channel layer) and, accordingly, the output of two transistors may be exhibited in the area of a single thin-film transistor. Accordingly, drain current and mobility may be improved, and an effect of reducing operation voltage movement may be exhibited.

The method of fabricating a multilayer-channel thin-film transistor according to one embodiment of the present invention includes the step (S110) of forming a first channel layer on a substrate.

The first channel layer may be formed by depositing an oxide semiconductor film on the substrate, and then forming a photoresist pattern on the oxide semiconductor film, and then selectively etching, i.e., patterning, the oxide semiconductor film using a photoresist pattern as a mask.

The first channel layer may be formed by a solution process or deposition.

When the first channel layer is formed by a solution process, the first channel layer may be formed using any one solution process selected from among spin coating, slit dye coating, ink-jet printing, spray coating, and dip coating.

The first channel layer may be formed using, preferably, spin coating. Spin coating is a method of coating with a centrifugal force applied to a solution by dropping a certain amount of the solution on a substrate and rotating the substrate at high speed.

The solution process may reduce process cost and process time through simplification of process technology compared to a deposition process.

When the first channel layer is formed by deposition, the deposition may be any of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, and sputtering.

According to an embodiment, the first channel layer is patterned on the substrate, but without being limited thereto, may be conformally formed on the substrate as in the first channel layer shown in FIG. 2A.

Preferably, an n-type oxide semiconductor may be used as the first channel layer.

The method of fabricating a multilayer-channel thin-film transistor according to one embodiment of the present invention includes the step (1220) of forming a first source electrode and first drain electrode on the first channel layer.

A first source electrode and a second drain electrode may be formed on the substrate on which the first channel layer is formed. Specifically, the first source electrode and the first drain electrode may be formed on the substrate, on which the first channel layer is formed, to be spaced apart from each other.

More specifically, the first source electrode and the second drain electrode may be formed on the substrate, on which the first channel layer is formed, to be spaced apart from each other by depositing a source/drain conductive layer on the substrate and the first channel layer and forming a photoresist pattern on the source/drain conductive layer, followed by selectively etching, i.e., patterning, the source/drain conductive layer using a photoresist pattern as a mask.

The source/drain conductive layer may be formed by any one method of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating and zone casting.

The method of fabricating a multilayer-channel thin-film transistor according to one embodiment of the present invention includes the step (S130) of forming a first gate insulating film on the first channel layer, the first source electrode and the first drain electrode.

The first gate insulating film may be formed by depositing a first gate insulating film on the substrate, the first channel layer, first source electrode and the second source electrode, and then forming a photoresist pattern on the first gate insulating film, and then selectively etching, i.e., patterning, the first gate insulating film using a photoresist pattern as a mask.

The first gate insulating film may be formed by a solution process or a deposition process.

When the first gate insulating film is formed by a solution process, the first gate insulating film may be formed using any one solution process selected from among spin coating, slit dye coating, ink-jet printing, spray coating, and dip coating.

When first gate insulating film is formed by deposition, the deposition may be any of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, and sputtering.

The method of fabricating a multilayer-channel thin-film transistor according to one embodiment of the present invention includes the step (S140) of forming a gate electrode on the first gate insulating film.

The gate electrode may be formed by depositing a gate conductive layer on the substrate and forming a photoresist pattern on the gate conductive layer, and then selectively etching, i.e., patterning the gate conductive layer using a photoresist pattern as a mask.

The method of fabricating a multilayer-channel thin-film transistor according to one embodiment of the present invention includes the step (S150) of forming a second gate insulating film on the first gate insulating film and the gate electrode.

The second gate insulating film may be formed in a solution process or a deposition process and may be formed by a method the same as or different from the method of fabricating the first gate insulating film.

The second gate insulating film may be formed on the first gate insulating film to cover the entire gate insulating film so that the gate electrode may be buried in the second gate insulating film.

The method of fabricating a multilayer-channel thin-film transistor according to one embodiment of the present invention includes the step (S160) of forming a second channel layer on the second gate insulating film.

The second channel layer may be formed in a solution process or a deposition process and may be formed by a method the same as or different from the method of fabricating the second channel layer.

The method of fabricating a multilayer-channel thin-film transistor according to one embodiment of the present invention includes the step (S170) of respectively forming a source electrode connection part and a drain electrode connection part on the first source electrode and the first drain electrode.

According to an embodiment, the step (S170) of respectively forming a source electrode connection part and a drain electrode connection part on the first source electrode and the first drain electrode may include a step (S171) of forming a first via hole on the first gate insulating film and second gate insulating film formed on the first source electrode, a step (S172) of forming a second via hole on the first gate insulating film and second gate insulating film formed on the first drain electrode, and a step (S173) of respectively forming a source electrode connection part and a drain electrode connection part inside the first via hole and the second via hole.

In the step (S171) of forming a first via hole on the first gate insulating film and second gate insulating film formed on the first source electrode, the first via hole may be formed by etching the first gate insulating film and the second gate insulating film using the photoresist pattern formed on the second gate insulating film such that the first source electrode is partially exposed.

In the step (S172) of forming a second via hole on the first gate insulating film and second gate insulating film formed on the first drain electrode, the second via hole may be formed by etching the first gate insulating film and the second gate insulating film using the photoresist pattern formed on the second gate insulating film such that the first drain electrode is partially exposed.

Preferably, steps S171 and S172 are not separately formed, and the first via hole and the second via hole may be simultaneously formed by etching the first gate insulating film and the second gate insulating film using the photoresist pattern formed on the second gate insulating film such that the first source electrode and the first drain electrode are partially exposed.

In the step (S173) of respectively forming a source electrode connection part and a drain electrode connection part inside the first via hole and the second via hole, a source electrode connection part and a drain connection part may be formed by filling a conductive material inside the first via hole and second via hole through which the first source electrode and the first drain electrode are partially exposed.

Accordingly, the first channel layer and the second channel layer may be simultaneously driven through the source electrode connection part and the drain electrode connection part, thereby improving drain current and mobility.

More specifically, electrons injected into the first source electrode may be collected in the first drain electrode through the first channel layer by the gate electrode 250, and electrons injected into the second source electrode may be collected in the second drain electrode through the second channel layer by the gate electrode, thereby improving drain current and mobility.

The method of fabricating a multilayer-channel thin-film transistor according to one embodiment of the present invention includes a step (S180) of forming a second source electrode on the second channel layer to be connected to the source electrode connection part; and a step (S190) of forming a second drain electrode on the second channel layer to be connected to the drain electrode connection part.

Preferably, steps S180 and S190 are not separately performed, and the second source electrode and the second drain electrode may be formed on the substrate, on which the first channel layer is formed, to be spaced apart from each other by depositing a source/drain conductive layer on the second gate insulating film and the second channel layer, and forming a photoresist pattern on the source/drain conductive layer, followed by selectively etching, i.e., patterning, the source/drain conductive layer using a photoresist pattern as a mask.

Here, the second source electrode and second drain electrode may be respectively formed on a source electrode connection part and drain connection part exposed from a surface of the second gate insulating film to be electrically connected to each other.

Figure 5:
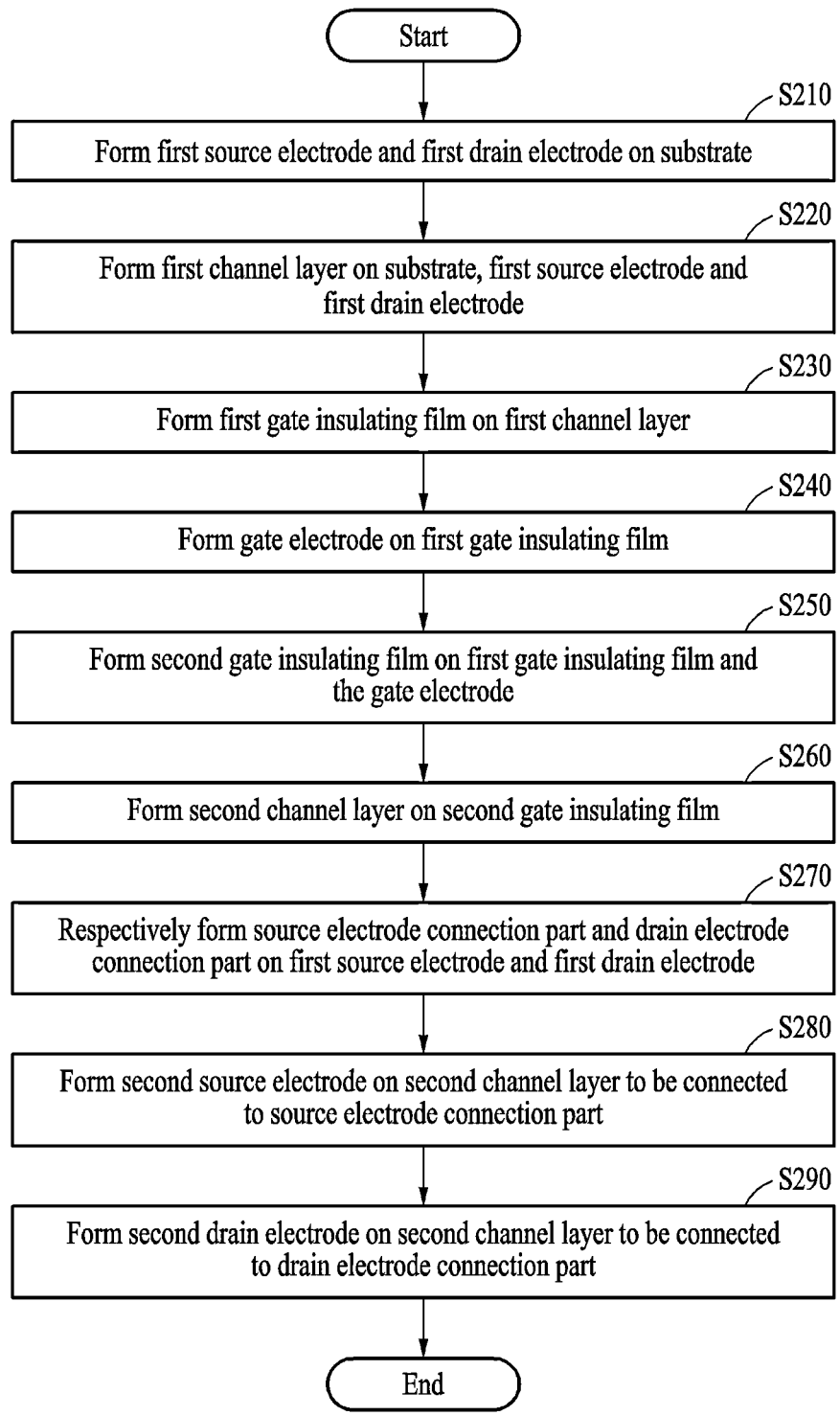
FIG. 5 is a flowchart for explaining a method of fabricating a multilayer-channel thin-film transistor according to another embodiment of the present invention.

FIG. 5 is a flowchart for explaining a method of fabricating a multilayer-channel thin-film transistor according to another embodiment of the present invention.

The method of fabricating a multilayer-channel thin-film transistor according to another embodiment of the present invention includes the same components as those of the method of fabricating a multilayer-channel thin-film transistor according to one embodiment of the present invention except that the fabrication order of the first channel layer and the first source electrode and second source electrode is different. Therefore, detailed description of the same components is omitted.

The method of fabricating a multilayer-channel thin-film transistor according to another embodiment of the present invention includes a step (S210) of forming a first source electrode and first drain electrode on a substrate, a step (S220) of forming a first channel layer on the substrate, the first source electrode and the first drain electrode, a step (S230) of forming a first gate insulating film on the first channel layer, the first channel layer, the first source electrode and the first drain electrode, a step (S240) of forming a gate electrode on the first gate insulating film, a step (S250) of forming a second gate insulating film on the first gate insulating film and the gate electrode, a step (S260) of forming a second channel layer on the second gate insulating film, a step (S270) of respectively forming a source electrode connection part and a drain electrode connection part on the first source electrode and the first drain electrode, a step (S280) of forming a second source electrode on the second channel layer to be connected to the source electrode connection part, and a step (S290) of forming a second drain electrode on the second channel layer to be connected to the drain electrode connection part.

In addition, the step (S270) of respectively forming a source electrode connection part and a drain electrode connection part on the first source electrode and the first drain electrode may include a step (S271) of forming a first via hole on the first gate insulating film and second gate insulating film formed on the first source electrode, a step (S272) of forming a second via hole the first gate insulating film and second gate insulating film formed on the first drain electrode, and a step (S273) of respectively forming a source electrode connection part and a drain electrode connection part inside the first via hole and the second via hole.

Accordingly, a multilayer-channel thin-film transistor fabricated by the method of fabricating a multilayer-channel thin-film transistor according to another embodiment of the present invention may include a first channel layer and a second channel layer so that current is separated into and flows into the first channel layer and the second channel layer when voltage is applied, thereby reducing threshold voltage shift and increasing an on-off ratio of the device.

In addition, the multilayer-channel thin-film transistor fabricated by the method of fabricating a multilayer-channel thin-film transistor according to another embodiment of the present invention may include the first channel layer and the second channel layer, so that current is separated into and flows into the first channel layer and the second channel layer when voltage is applied, thereby improving the stability of the device.

In addition, the multilayer-channel thin-film transistor fabricated by the method of fabricating a multilayer-channel thin-film transistor according to another embodiment of the present invention may be formed by vertically laminating a lower gate thin-film transistor including a first channel layer, a first source electrode and first drain electrode formed on the first channel layer, a first gate insulating film formed on the first channel layer, the first source electrode and first drain electrode, and a gate electrode formed on the first gate insulating film; and an upper gate thin-film transistor including a gate electrode, a second gate insulating film formed on the gate electrode, a second channel layer formed on the second gate insulating film, and a second source electrode and second drain electrode formed on the second channel layer to be connected to each other in parallel with respect to gate electrode, so that the multilayer-channel thin-film transistor may receive output from the two thin-film transistors (the first channel layer and the second channel layer) and, accordingly, the output of two transistors may be exhibited in the area of a single thin-film transistor. Accordingly, drain current and mobility may be improved, and an effect of reducing operation voltage movement may be exhibited.

In addition, in the case of the multilayer-channel thin-film transistor fabricated by the method of fabricating a multilayer-channel thin-film transistor according to another embodiment of the present invention, the first channel layer and the second channel layer may be simultaneously driven through the source electrode connection part and the drain electrode connection part, thereby improving drain current and mobility.

More specifically, electrons injected into the first source electrode may be collected in the first drain electrode through the first channel layer by the gate electrode 250, and electrons injected into the second source electrode may be collected in the second drain electrode through the second channel layer by the gate electrode, thereby improving drain current and mobility.

The method of fabricating a multilayer-channel thin-film transistor according to another embodiment of the present invention includes a step (S210) of forming a first source electrode and first drain electrode on the substrate.

The first source electrode and the second drain electrode may be formed on the substrate and specifically, the first source electrode and the first drain electrode may be formed on the substrate to be spaced apart from each other.

More specifically, the first source electrode and second drain electrode may be formed on the substrate to be spaced apart from each other by depositing a source/drain conductive layer on the substrate and forming a photoresist pattern on the source/drain conductive layer, followed by selectively etching, i.e., patterning, the source/drain conductive layer using a photoresist pattern as a mask.

The method of fabricating a multilayer-channel thin-film transistor according to another embodiment of the present invention includes a step (S220) of forming a first channel layer on the substrate, the first source electrode and the first drain electrode.

The first channel layer may be formed by depositing an oxide semiconductor film on the substrate, the first source electrode and the first drain electrode, and then forming a photoresist pattern on the oxide semiconductor film, and then selectively etching, i.e., patterning, the oxide semiconductor film using a photoresist pattern as a mask.

The first channel layer may be formed by a solution process or deposition.

When the first channel layer is formed by a solution process, the first channel layer may be formed using any one solution process selected from among spin coating, slit dye coating, ink-jet printing, spray coating, and dip coating.

The first channel layer may be formed using, preferably, spin coating. Spin coating is a method of coating with a centrifugal force applied to a solution by dropping a certain amount of the solution on a substrate and rotating the substrate at high speed.

The solution process may reduce process cost and process time through simplification of process technology compared to a deposition process.

When the first channel layer is formed by deposition, the deposition may be any of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, and sputtering.

According to an embodiment, the first channel layer is conformally formed on the substrate, but without being limited thereto, may be conformally formed on the substrate 110 as in the first channel layer shown in FIG. 1A.

The method of fabricating a multilayer-channel thin-film transistor according to another embodiment of the present invention includes a step (S230) of forming a first gate insulating film on the first channel layer.

The first gate insulating film may be formed by depositing a first gate insulating film on the first channel layer, and then forming a photoresist pattern on the first gate insulating film, and then selectively etching, i.e., patterning, the first gate insulating film using a photoresist pattern as a mask.

The first gate insulating film may be formed by a solution process or a deposition process.

When the first gate insulating film is formed by a solution process, the first gate insulating film may be formed using any one solution process selected from among spin coating, slit dye coating, ink-jet printing, spray coating, and dip coating.

When first gate insulating film is formed by deposition, the deposition may be any of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, and sputtering.

Steps S240 to step S290 may be performed in the same manner as in the method of fabricating a multilayer-channel thin-film transistor according to one embodiment of the present invention. Therefore, detailed description thereof is omitted.

Comparative Example 1: Single-Channel Thin-Film Transistor (TG TFT) Including Upper Gate A glass substrate was placed in a sonicator and washed in acetone and methanol solutions for 5 minutes each, followed by blowing with nitrogen ($N_2$). Next, an IGZO channel layer having a thickness of 30 nm was formed on the substrate using RF-sputter (60 W, room temperature, Ar 28.5 sccm, O2 1.5 sccm, PO2=5%). Next, Ti/Au source/drain electrodes having a thickness of 20/40 nm were formed using an E-beam evaporator. Next, a 50 nm $Al_2O_3$ gate insulating film was formed (150° C. TMA precursor+$H_2O$ (oxidant)) using atomic layer deposition (ALD). Next, a Ti gate electrode having a thickness of 100 nm was formed using an E-beam evaporator, and post annealing was performed for 1 hour at 260° C. in an air atmosphere. All patterning was performed using photolithography-lift off.

Comparative Example 2: Single-Channel Thin-Film Transistor (BG TFT) Including Lower Gate A glass substrate was placed in a sonicator and washed in acetone and methanol solutions for 5 minutes each, followed by blowing with nitrogen ($N_2$). Next, a Ti gate electrode having a thickness of 100 nm was formed using an E-beam evaporator. Next, a 50 nm $Al_2O_3$ gate insulating film was formed (150° C. TMA precursor+$H_2O$ (oxidant)) using atomic layer deposition (ALD). Next, an IGZO channel layer having a thickness of 30 nm was formed using a RF-sputter (60 W, room temperature, Ar 30 sccm O2 1.5 sccm, PO2=0%). Next, a Ti/Au source/drain electrode having a thickness of 20/40 nm was formed using an E-beam evaporator, and post annealing was performed for 1 hour at 260° C. in an air atmosphere. All patterning was performed using photolithography-lift off.

Comparative Example 3: TG+BG TFT

TG+BG TFT does not mean separate devices and means a simple sum of data values of the single-channel thin-film transistor (TG TFT) including the upper gate fabricated according to Comparative Example 1 and the single-channel thin-film transistor (BG TFT) including the lower gate fabricated according to Comparative Example 2.

[Example]: Multilayer-Channel Thin-Film Transistor (DC TFT)

A glass substrate was placed in a sonicator and washed in acetone and methanol solutions for 5 minutes each, followed by blowing with nitrogen ($N_2$). Next, an IGZO channel layer having a thickness of 30 nm was formed on the substrate using RF-sputter (60 W, room temperature, Ar 28.5 sccm, O2 1.5 sccm, PO2=5%). Next, Ti/Au source/drain electrodes having a thickness of 20/40 nm were formed using an E-beam evaporator. Next, a 50 nm $Al_2O_3$ gate insulating film was formed (150° C. TMA precursor+$H_2O$ (oxidant)) using atomic layer deposition (ALD). Next, a Ti gate electrode having a thickness of 100 nm was formed using an E-beam evaporator. Next, a 50 nm $Al_2O_3$ first gate insulating film was formed (150° C. TMA precursor+$H_2O$ (oxidant)) using atomic layer deposition (ALD). Next, a second IGZO channel layer having a thickness of 30 nm was formed using RF-sputter (60 W, room temperature, Ar 30 sccm O2 1.5 sccm, PO2=0%). Next, wet etching was performed at 100° C. for 20 seconds using a $Al_2O_3$ etchant (Ceramic etchant A, Sigma Aldrich) to form first and second via holes, and a 100 nm of Ti was deposited using an E-beam evaporator to form a Ti source electrode connection part and a drain electrode connection part. Next, second Ti/Au source/drain electrodes having a thickness of 20/40 nm were formed using an E-beam evaporator, and post annealing was performed for 1 hour at 260° C. in an air atmosphere. All patterning was performed using photolithography-lift off.

Figure 6:
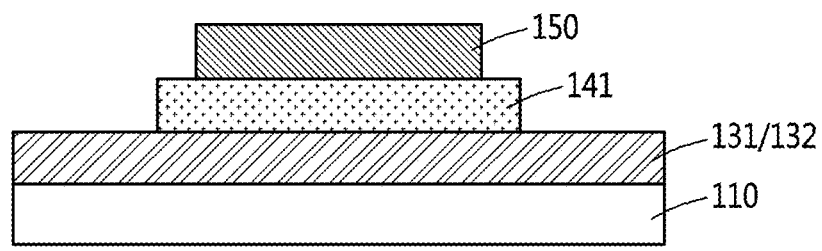
FIG. 6 is a cross-sectional view of the MIM structure of a multilayer-channel thin-film transistor according to one embodiment of the present invention.
Figure 7:
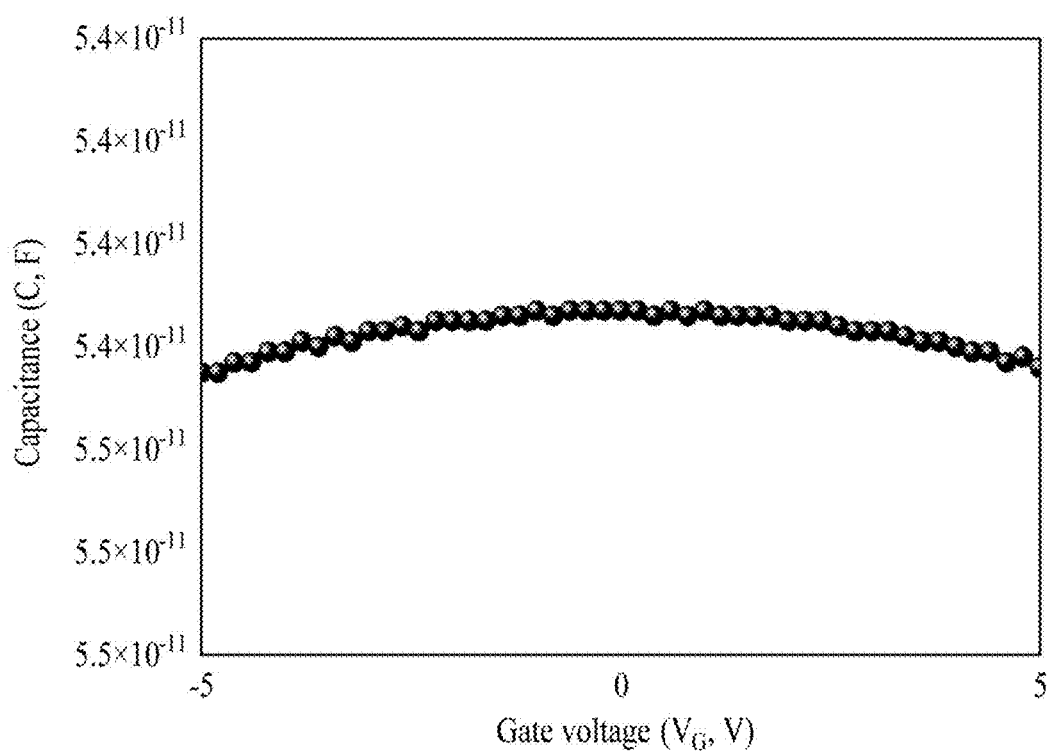
FIG. 7 is a graph showing the capacitance-gate voltage (C-V) characteristics of a multilayer-channel thin-film transistor according to one embodiment of the present invention.

FIG. 6 is a cross-sectional view of the MIM structure of a multilayer-channel thin-film transistor according to one embodiment of the present invention, and FIG. 7 is a graph showing the capacitance-gate voltage (C-V) characteristics of a multilayer-channel thin-film transistor according to one embodiment of the present invention.

In the multilayer-channel thin-film transistor according to one embodiment of the present invention, the substrate 110, the first source electrode 131 or the first drain electrode 132, the first gate insulating film 141 and the gate electrode 150 may have an MIM (metal-insulator-metal) structure.

The capacitance of the first gate insulating film 141 deposited through atomic layer deposition (ALD) to have the MIM structure was measured. It can be confirmed that the capacitance of the first gate insulating film 141 is $C_{ox}=136$ nF/cm$^2$.

Figure 8:
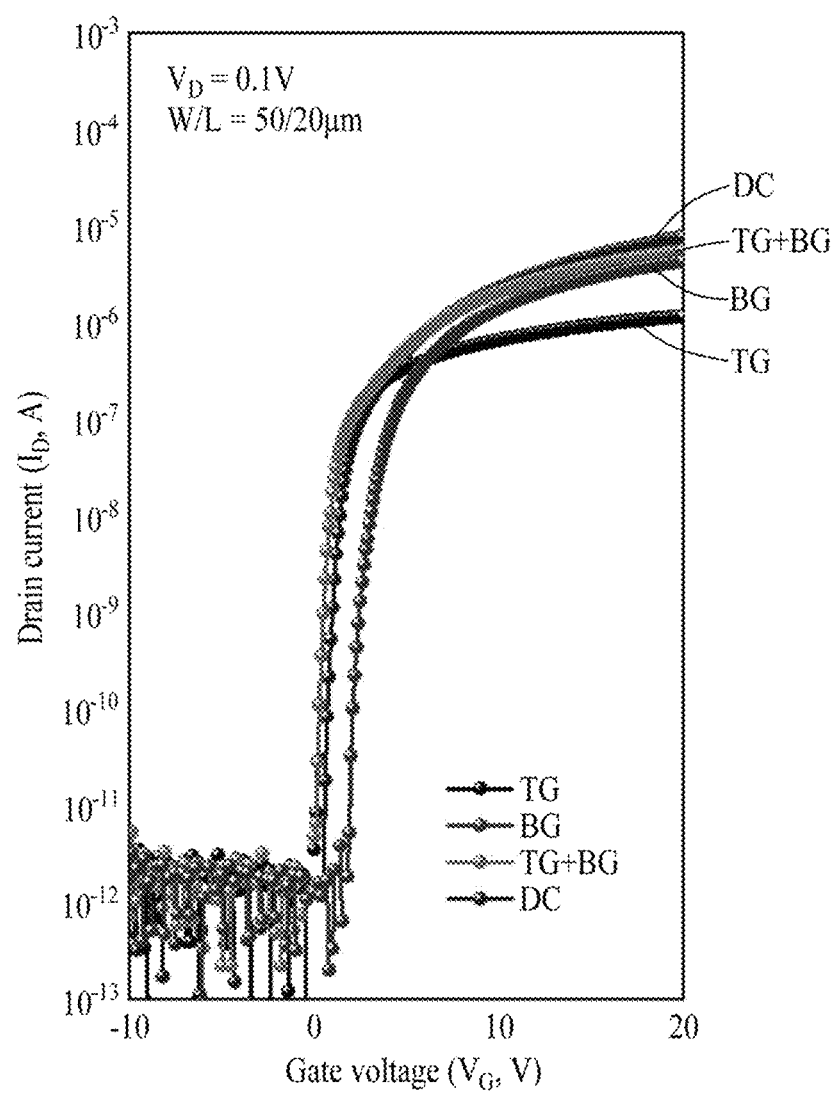
FIG. 8 is a graph showing the transfer characteristics of a single-channel thin-film transistor (TG TFT) according to Comparative Example 1, a single-channel thin-film transistor (BG TFT) according to Comparative Example 2, a single-channel thin-film transistor (TG+BG) including a double gate electrode, and a multilayer-channel thin-film transistor (DC TFT) according to one embodiment of the present invention when drain current is 0.1 V ($V_{DS}$=0.1 V).

FIG. 8 is a graph showing the transfer characteristics of a single-channel thin-film transistor (TG TFT) according to Comparative Example 1, a single-channel thin-film transistor (BG TFT) according to Comparative Example 2, and a multilayer-channel thin-film transistor (DC TFT) according to one embodiment of the present invention when drain current is 0.1 V ($V_{DS}$=0.1 V).

Comparative Example 1 is a single-channel thin-film transistor (TG TFT) including an upper gate electrode, Comparative Example 2 is a single-channel thin-film transistor (BG TFT) including a lower gate electrode, and Comparative Example 3 (TG+BG TFT) is a simple sum of a TG TFT graph and a BG TFT graph.

Figure 9:
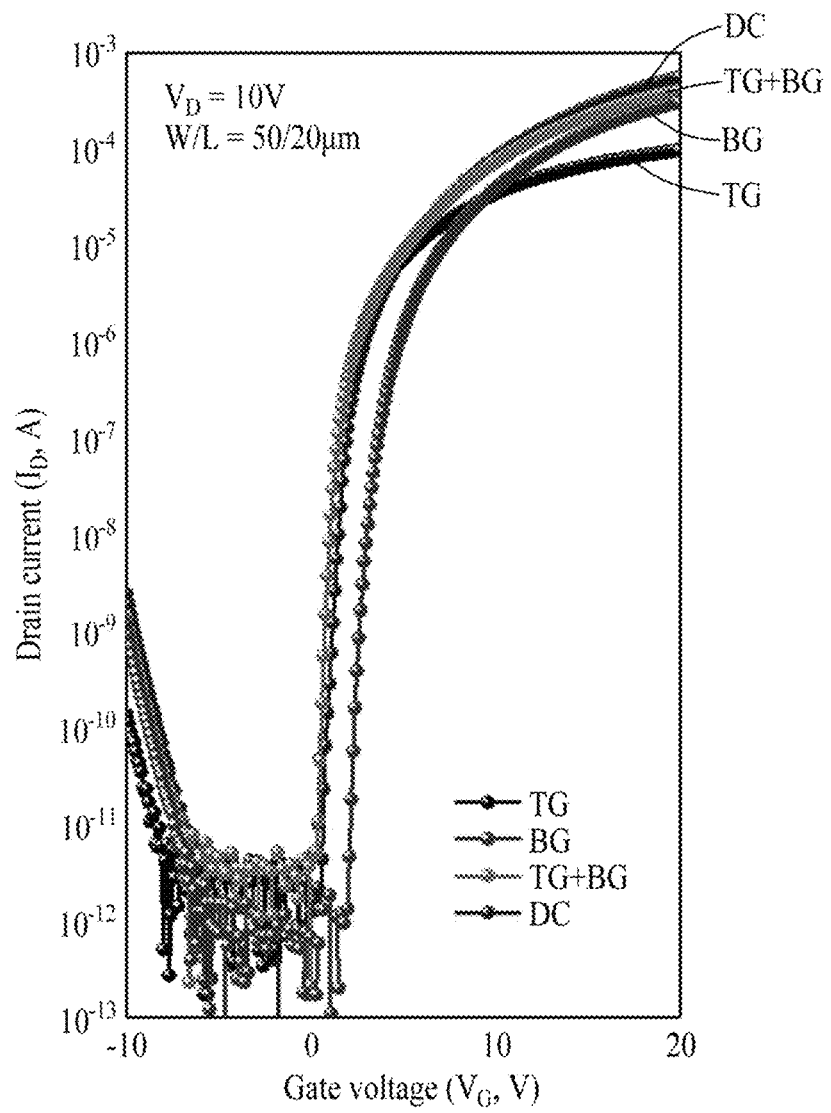
FIG. 9 is a graph showing the transfer characteristics of a single-channel thin-film transistor (TG TFT) according to Comparative Example 1, a single-channel thin-film transistor (BG TFT) according to Comparative Example 2, and a multilayer-channel thin-film transistor (DC TFT) according to one embodiment of the present invention when drain current is 10 V ($V_{DS}$=10 V).

FIG. 9 is a graph showing the transfer characteristics of a single-channel thin-film transistor (TG TFT) according to Comparative Example 1, a single-channel thin-film transistor (BG TFT) according to Comparative Example 2, and a multilayer-channel thin-film transistor (DC TFT) according to one embodiment of the present invention when drain current is 10 V ($V_{DS}$=10 V).

Figure 10:
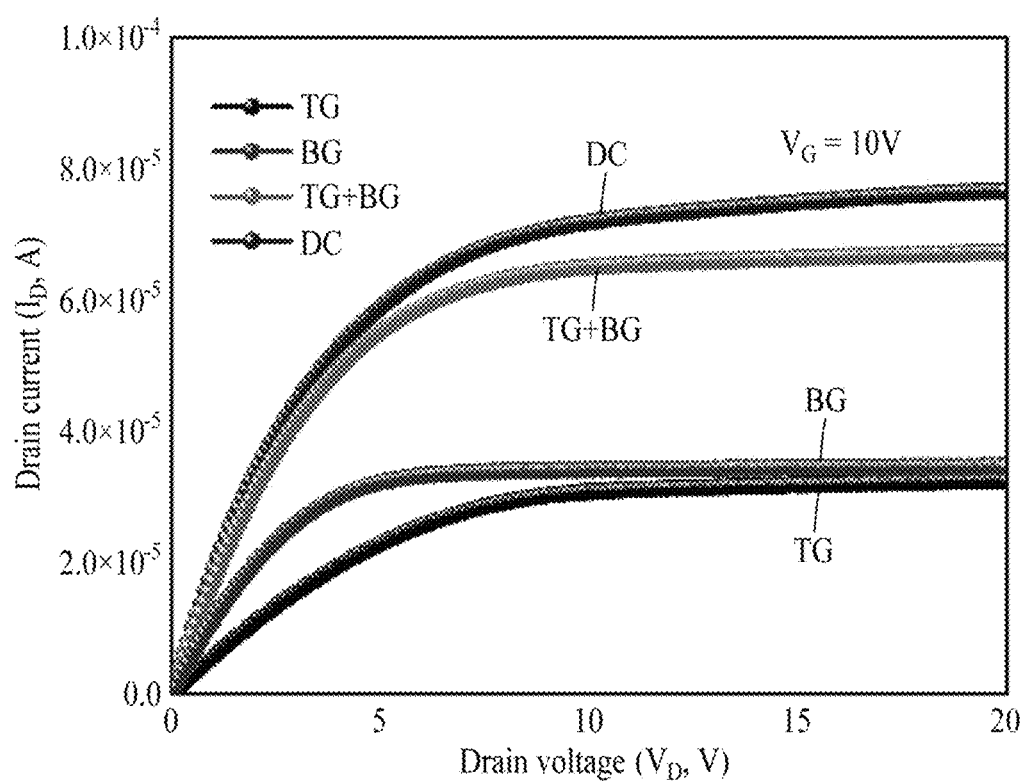
FIG. 10 is a graph showing the output characteristics of a single-channel thin-film transistor (TG TFT) according to Comparative Example 1, a single-channel thin-film transistor (BG TFT) according to Comparative Example 2, and a multilayer-channel thin-film transistor (DC TFT) according to one embodiment of the present invention.

FIG. 10 is a graph showing the output characteristics of a single-channel thin-film transistor (TG TFT) according to Comparative Example 1, a single-channel thin-film transistor (BG TFT) according to Comparative Example 2, and a multilayer-channel thin-film transistor (DC TFT) according to one embodiment of the present invention.

In FIGS. 8 to 10, a channel width (W) is 50 μm, and a channel length (L) is 20 μm.

Table 1 shows the electrical properties of the single-channel thin-film transistor (TG TFT) according to Comparative Example 1, the single-channel thin-film transistor (BG TFT) according to Comparative Example 2 and the multilayer-channel thin-film transistor (DC TFT) according to one embodiment of the present invention.

to the single-channel thin-film transistor (TG TFT) according to Comparative Example 1 and the single-channel thin-film transistor (BG TFT) according to Comparative Example 2.

However, it can be confirmed that the subthreshold swing (SS) of operation voltage and threshold voltage are similar.

It can be confirmed that the mobility characteristic is significantly improved, and the threshold voltage is reduced.

Accordingly, referring to FIGS. 8 to 10 and Table 1, it can be confirmed that the multilayer-channel thin-film transistor (DC TFT) according to one embodiment of the present invention has a higher drain current compared to the single-channel thin-film transistor (TG TFT) according to Comparative Example 1 and single-channel thin-film transistor (BG TFT) according to Comparative Example 2 including a single channel layer and, furthermore, exhibits performances (e.g., drain current increase and mobility increase) superior to the performance of Comparative Example 3 corresponding the sum of the performances of the single-channel thin-film transistor (TG TFT) according to Comparative Example 1 and the single-channel thin-film transistor (BG TFT) according to Comparative Example 2.

Figure 11:
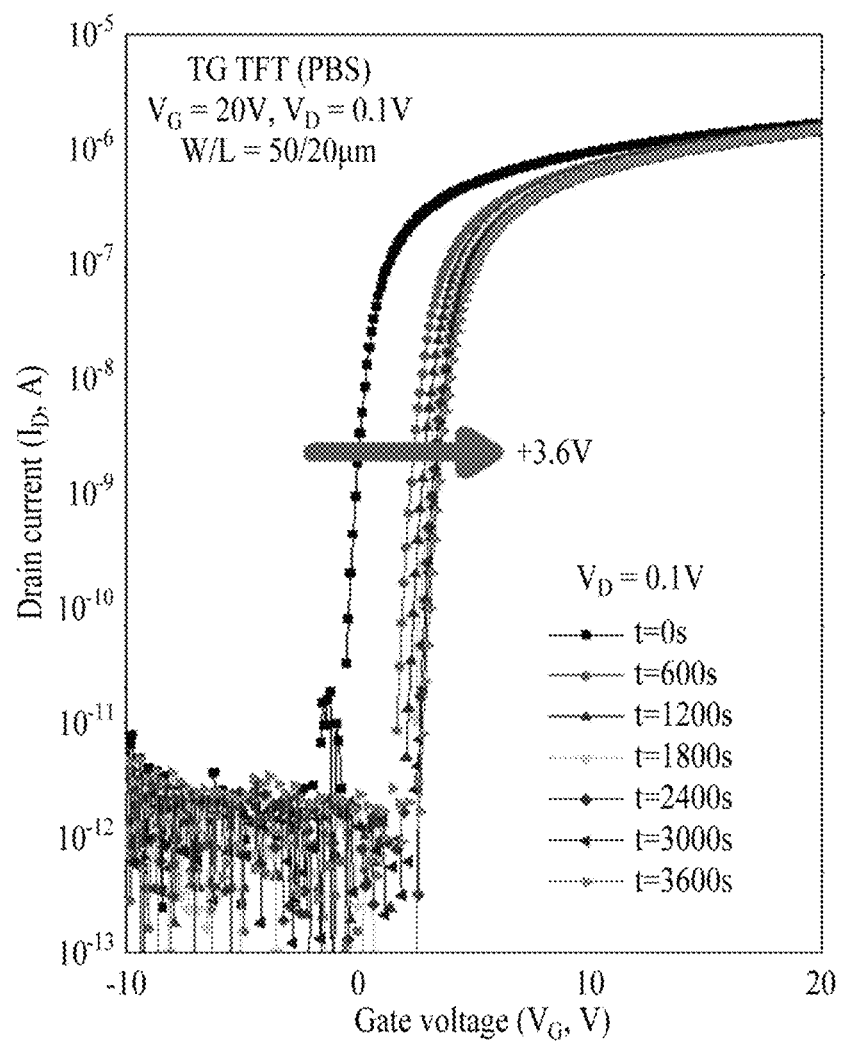
FIG. 11 is a graph illustrating a transmission curve of a single-channel thin-film transistor (TG TFT) according to Comparative Example 1 under positive bias stress (PBS).

FIG. 11 is a graph illustrating a transmission curve of a single-channel thin-film transistor (TG TFT) according to Comparative Example 1 under positive bias stress (PBS).

Figure 12:
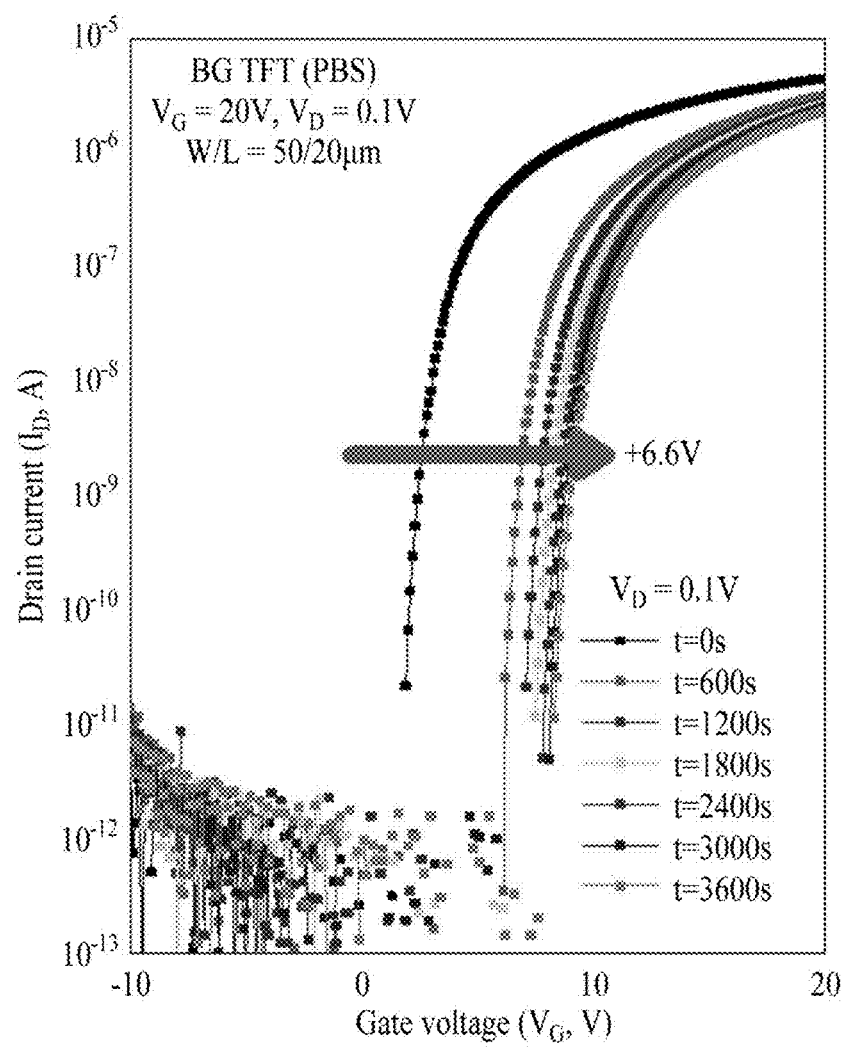
FIG. 12 is a graph illustrating a transmission curve of a single-channel thin-film transistor (BG TFT) according to Comparative Example 2 under positive bias stress (PBS).

FIG. 12 is a graph illustrating a transmission curve of a single-channel thin-film transistor (BG TFT) according to Comparative Example 2 under positive bias stress (PBS).

Figure 13:
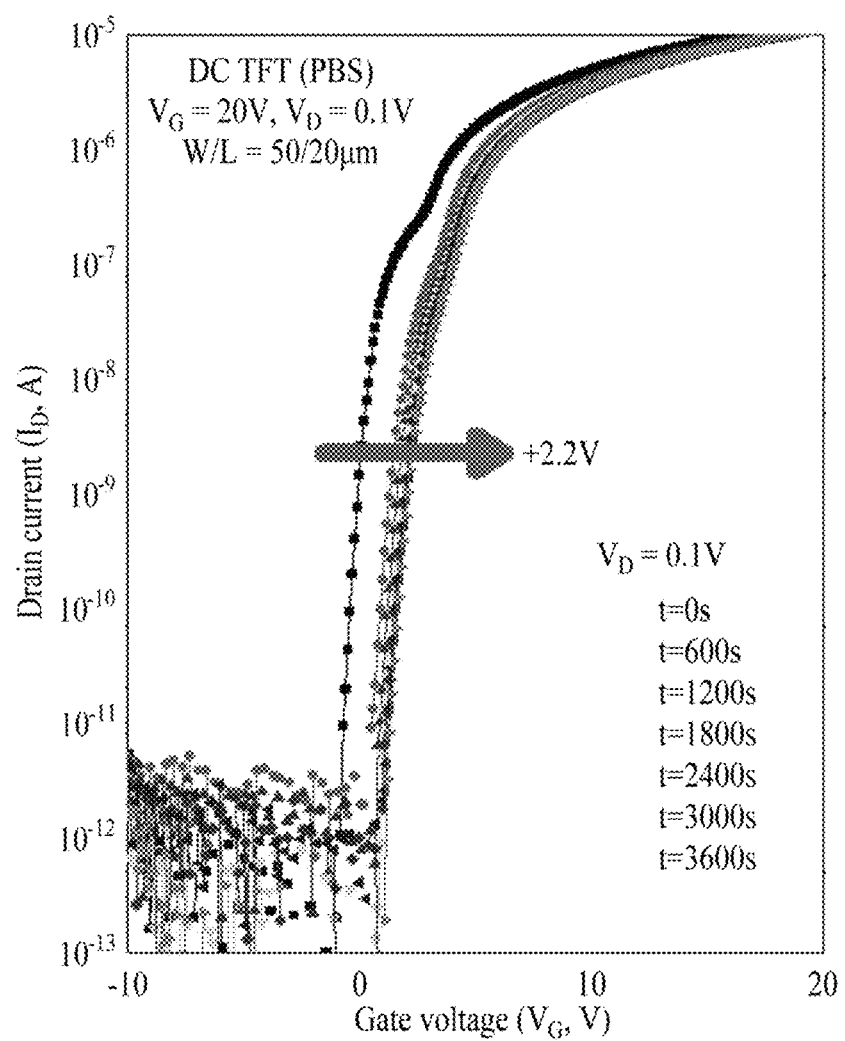
FIG. 13 is a graph illustrating a transmission curve of a multilayer-channel thin-film transistor (DC TFT) according to one embodiment of the present invention under positive bias stress (PBS).

FIG. 13 is a graph illustrating a transmission curve of a multilayer-channel thin-film transistor (DC TFT) according to one embodiment of the present invention under positive bias stress (PBS).

In FIGS. 11 to 13, a gate current ($V_{GS}$) is 20 V, and a drain current ($V_{DS}$) is 0.1 V.

In FIGS. 11 to 13, a channel width (W) is 50 μm, and a channel length (L) is 20 μm.

Referring to FIGS. 11 to 13, it can be confirmed that the multilayer-channel thin-film transistor (DC TFT) according to one embodiment of the present invention exhibits a reduced threshold voltage shift under positive bias stress (PBS), compared to the single-channel thin-film transistor

TABLE 1

|  | Field-effect mobility, $\mu_{FE}$, cm$^2$/Vs | Saturation mobility, $\mu_{Sat}$, cm$^2$/Vs | Threshold voltage ($V_{th}$, V) | Subthreshold swing, S.S, V/decade | On current at $V_D$ = 10 V, $V_G$ = 20 V (mA) | On/off ratio |
|---|---|---|---|---|---|---|
| TG TFT | 3.6 | 3.0 | 0.6 | 0.176 | 0.097 | >10$^8$ |
| BG TFT | 8.98 | 8.86 | 2.6 | 0.203 | 0.306 | >10$^9$ |
| DC TFT | 17.58 | 13.74 | 1.1 | 0.183 | 0.558 | >10$^9$ |

Referring to FIGS. 8 to 10, it can be confirmed that the multilayer-channel thin-film transistor (DC TFT) according to one embodiment of the present invention exhibits improved transfer characteristics and output characteristics compared to the single-channel thin-film transistor (TG TFT) according to Comparative Example 1, the single-channel thin-film transistor (BG TFT) according to Comparative Example 2 and the single-channel thin-film transistor (TG+BG TFT) including the double gate electrode.

Referring to Table 1, it can be confirmed that the multilayer-channel thin-film transistor (DC TFT) according to one embodiment of the present invention includes the first channel layer and the second channel layer, thereby exhibits improved drain current, mobility and on/off ratio compared (TG TFT) according to Comparative Example 1 and the single-channel thin-film transistor (BG TFT) according to Comparative Example 2.

In addition, with regard to the operation voltage by a bias stress test, the operation voltage mobility of the multilayer-channel thin-film transistor (DC TFT) according to one embodiment of the present invention is reduced compared to the single-channel thin-film transistor (TG TFT) according to Comparative Example 1 and the single-channel thin-film transistor (BG TFT) according to Comparative Example 2. From this result, it can be confirmed that the multilayer-channel thin-film transistor (DC TFT) according to one embodiment of the present invention has high reliability.

Figure 14:
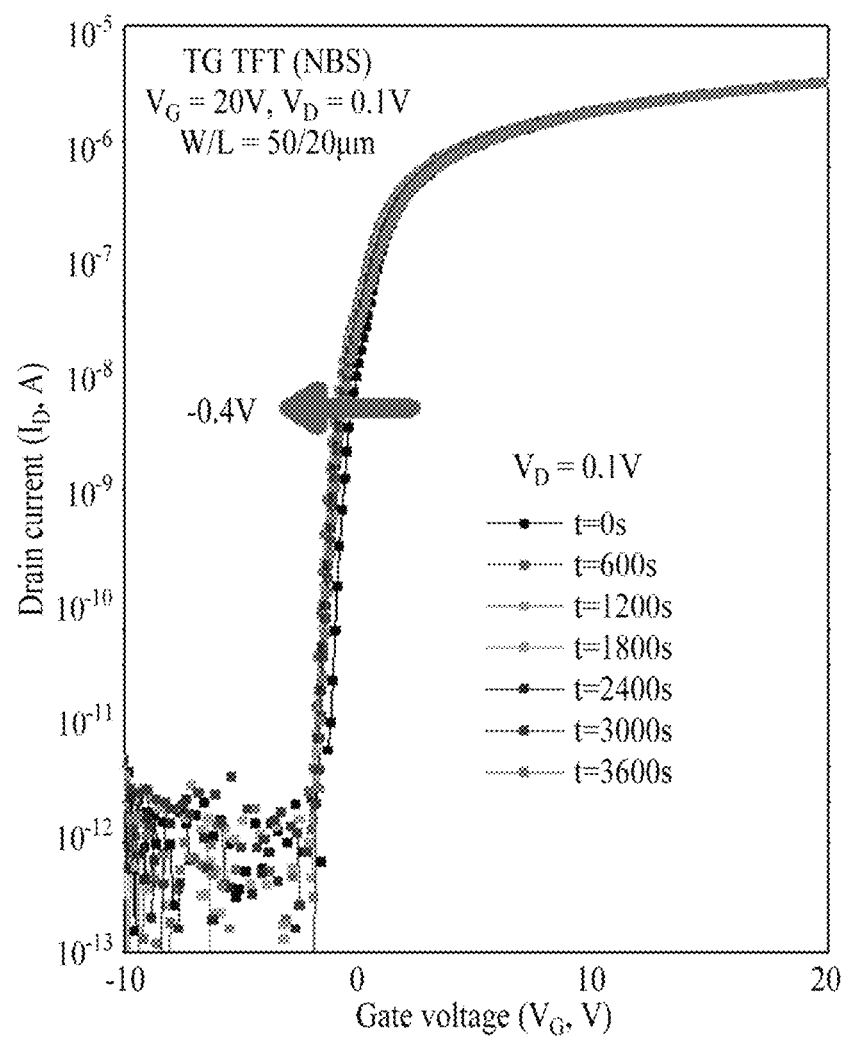
FIG. 14 is a graph illustrating a transmission curve of a single-channel thin-film transistor (TG TFT) according to Comparative Example 1 under negative bias stress (NBS).

FIG. 14 is a graph illustrating a transmission curve of a single-channel thin-film transistor (TG TFT) according to Comparative Example 1 under negative bias stress (NBS).

Figure 15:
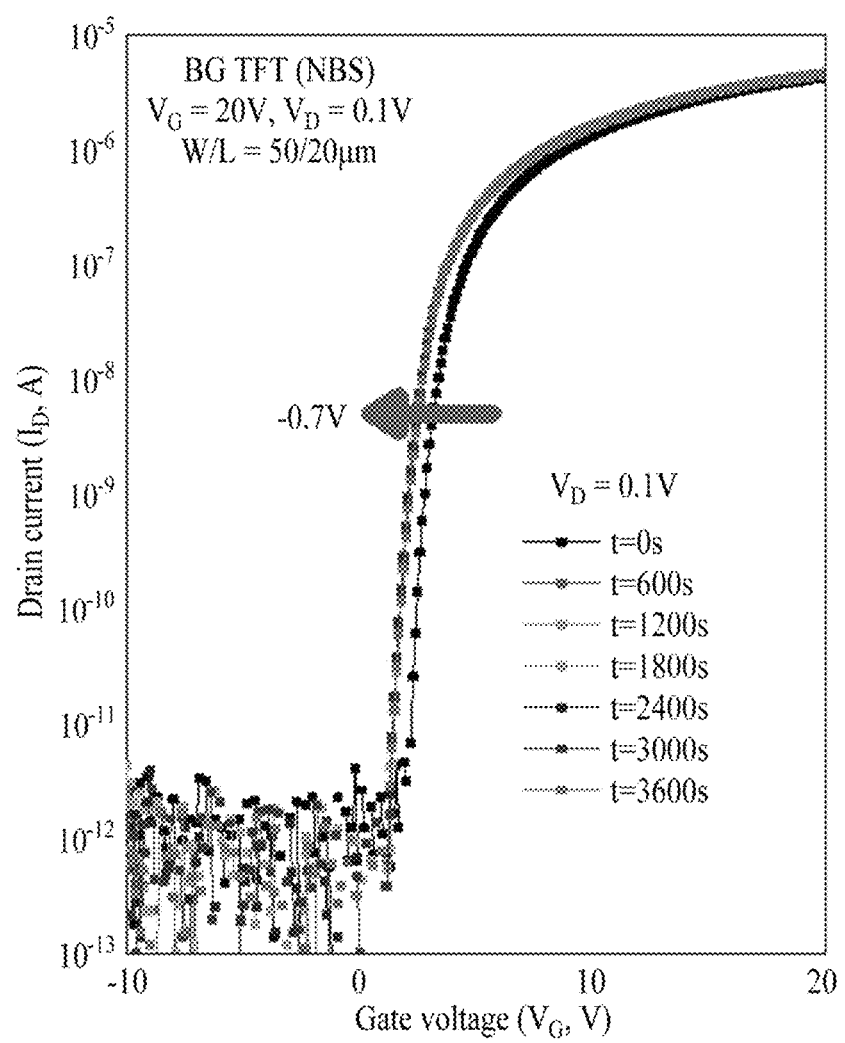
FIG. 15 is a graph illustrating a transmission curve of a single-channel thin-film transistor (TG TFT) according to Comparative Example 2 under negative bias stress (NBS).

FIG. 15 is a graph illustrating a transmission curve of a single-channel thin-film transistor (TG TFT) according to Comparative Example 1 under negative bias stress (NBS).

Figure 16:
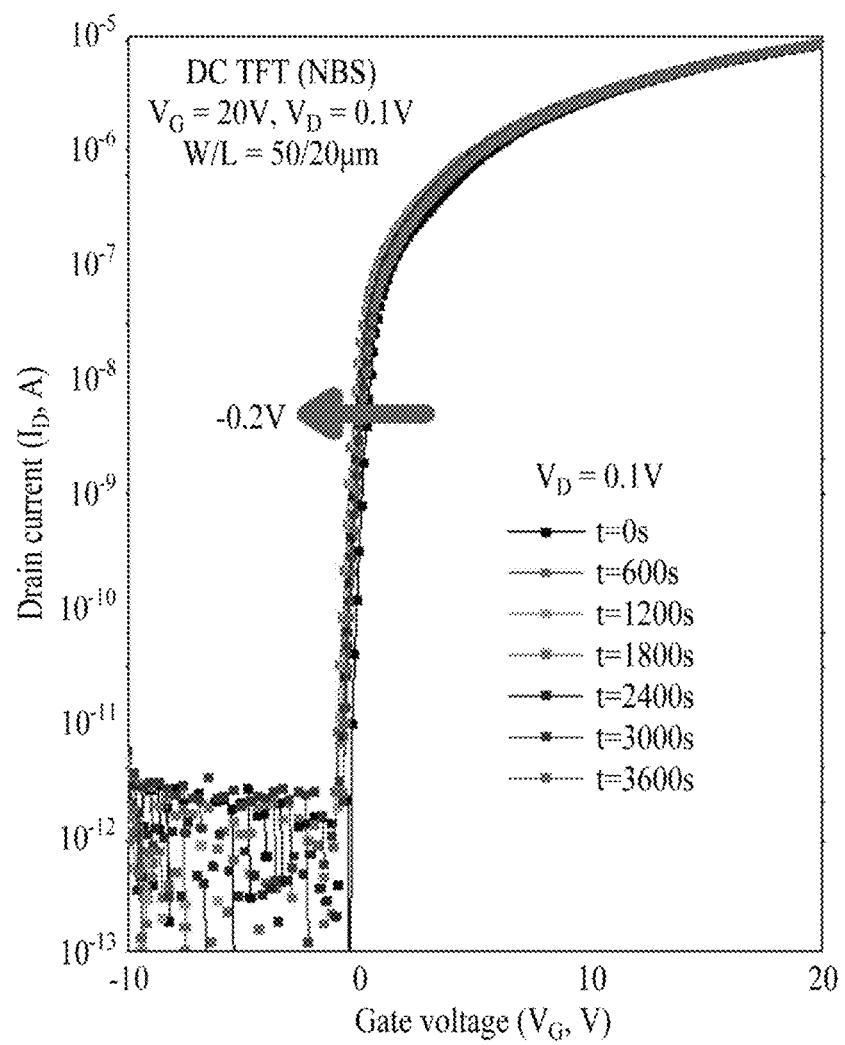
FIG. 16 is a graph illustrating a transmission curve of a multilayer-channel thin-film transistor (DC TFT) according to one embodiment of the present invention under negative bias stress (NBS).

FIG. 16 is a graph illustrating a transmission curve of a multilayer-channel thin-film transistor (DC TFT) according to one embodiment of the present invention under negative bias stress (NBS).

In FIGS. 14 to 16, a gate current ($V_{GS}$) is −20 V, and a drain current ($V_{DS}$) is 0.1 V.

In FIGS. 14 to 16, a channel width (W) is 50 μm, and a channel length (L) is 20 μm.

Referring to FIGS. 14 to 16, it can be confirmed that the multilayer-channel thin-film transistor (DC TFT) according to one embodiment of the present invention exhibits a reduced threshold voltage shift under negative bias stress (NBS), compared to the single-channel thin-film transistor (TG TFT) according to Comparative Example 1 and the single-channel thin-film transistor (BG TFT) according to Comparative Example 2.

In addition, with regard to the operation voltage by a bias stress test, the operation voltage mobility of the multilayer-channel thin-film transistor (DC TFT) according to one embodiment of the present invention is reduced compared to the single-channel thin-film transistor (TG TFT) according to Comparative Example 1 and the single-channel thin-film transistor (BG TFT) according to Comparative Example 2. From this result, it can be confirmed that the multilayer-channel thin-film transistor (DC TFT) according to one embodiment of the present invention has high reliability.

Figure 17:
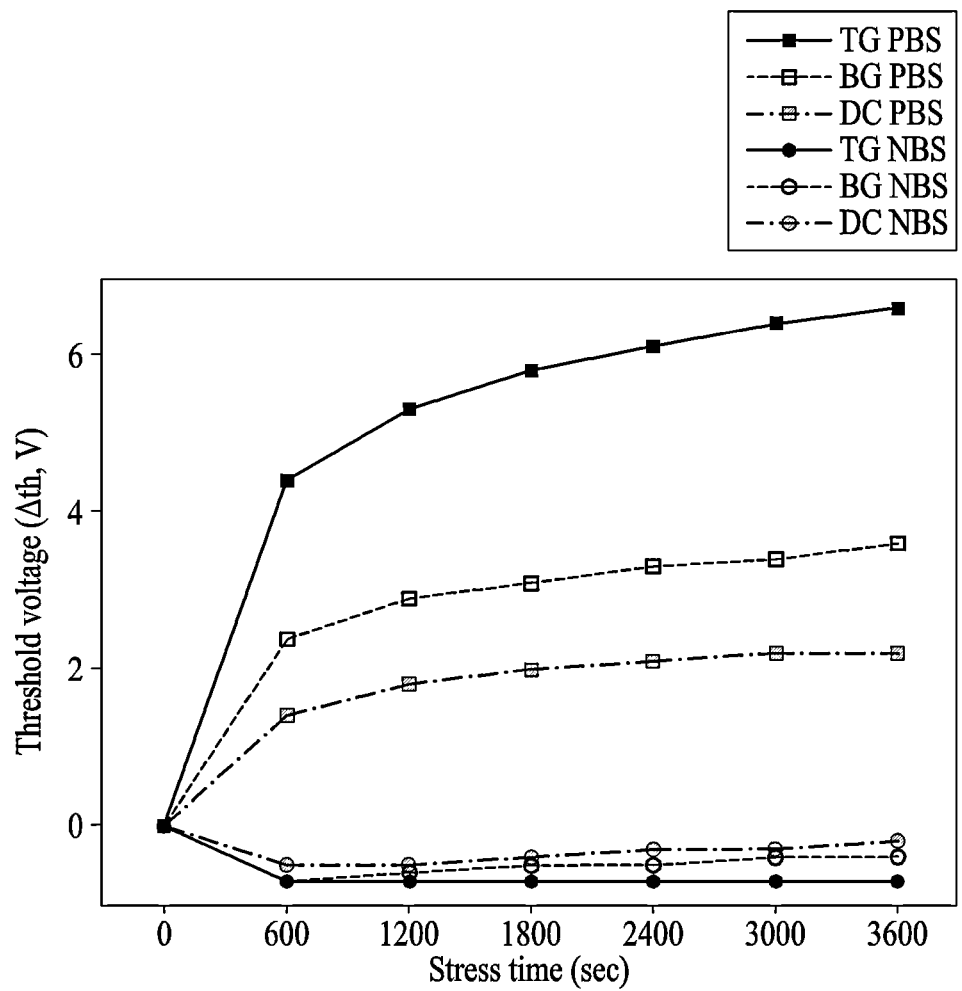
FIG. 17 is a graph illustrating a change in a threshold voltage (Vth) dependent upon a stress time of a single-channel thin-film transistor (TG TFT) according to Comparative Example 1, the single-channel thin-film transistor (BG TFT) according to Comparative Example 2 and a multilayer-channel thin-film transistor (DC TFT) according to one embodiment of the present invention under a positive bias stress (PBS) and a negative bias stress (NBS).

FIG. 17 is a graph illustrating a change in a threshold voltage (Vth) dependent upon a stress time of a single-channel thin-film transistor (TG TFT) according to Comparative Example 1, the single-channel thin-film transistor (BG TFT) according to Comparative Example 2 and a multilayer-channel thin-film transistor (DC TFT) according to one embodiment of the present invention under a positive bias stress (PBS) and a negative bias stress (NBS).

Referring to FIG. 17, it can be confirmed that the multilayer-channel thin-film transistor (DC TFT) according to one embodiment of the present invention has high stability against stress, compared to the single-channel thin-film transistor (TG TFT) according to Comparative Example 1 and the single-channel thin-film transistor (BG TFT) according to Comparative Example 2.

In addition, with the operation voltage by a bias stress test, the multilayer-channel thin-film transistor (DC TFT) according to one embodiment of the present invention exhibits a reduced operation voltage mobility, compared to the single-channel thin-film transistor (TG TFT) according to Comparative Example 1 and the single-channel thin-film transistor (BG TFT) according to Comparative Example 2. From this result, it can be confirmed that the multilayer-channel thin-film transistor (DC TFT) according to one embodiment of the present invention has high reliability.

Figure 18:
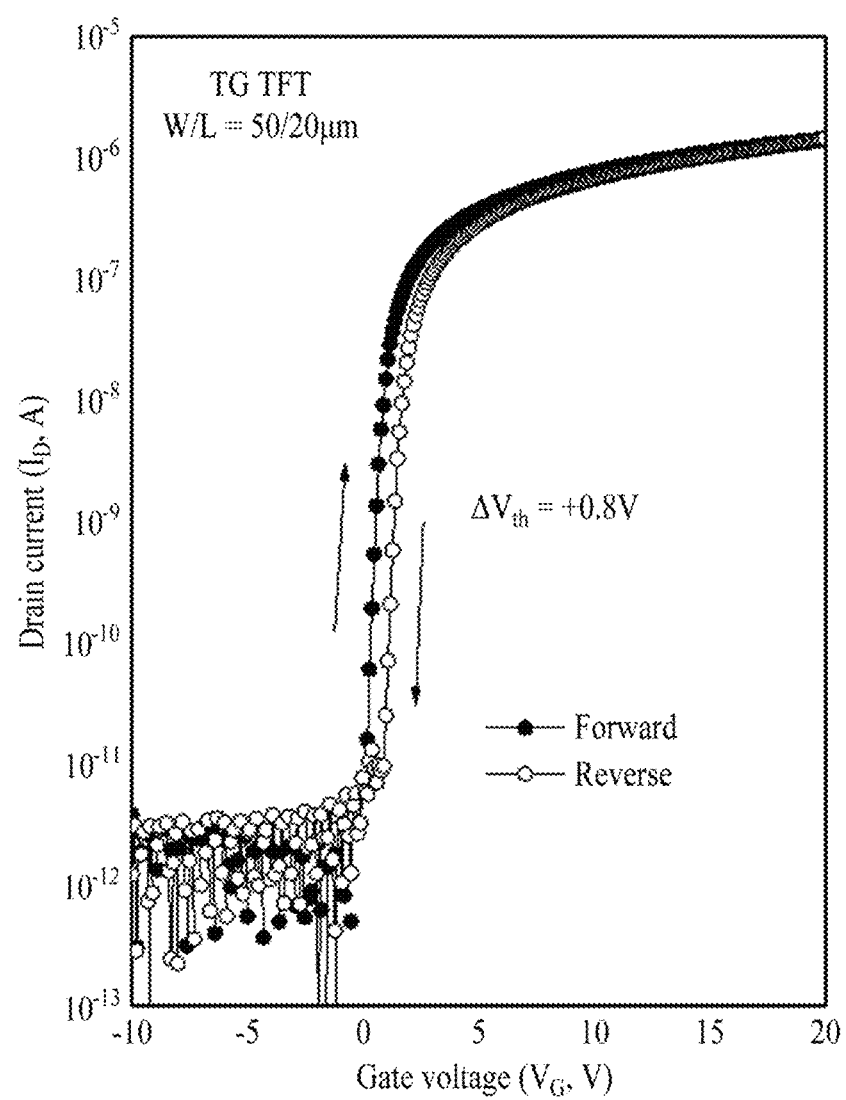
FIG. 18 is a graph illustrating a hysteresis behavior of a single-channel thin-film transistor (TG TFT) according to Comparative Example 1.
Figure 19:
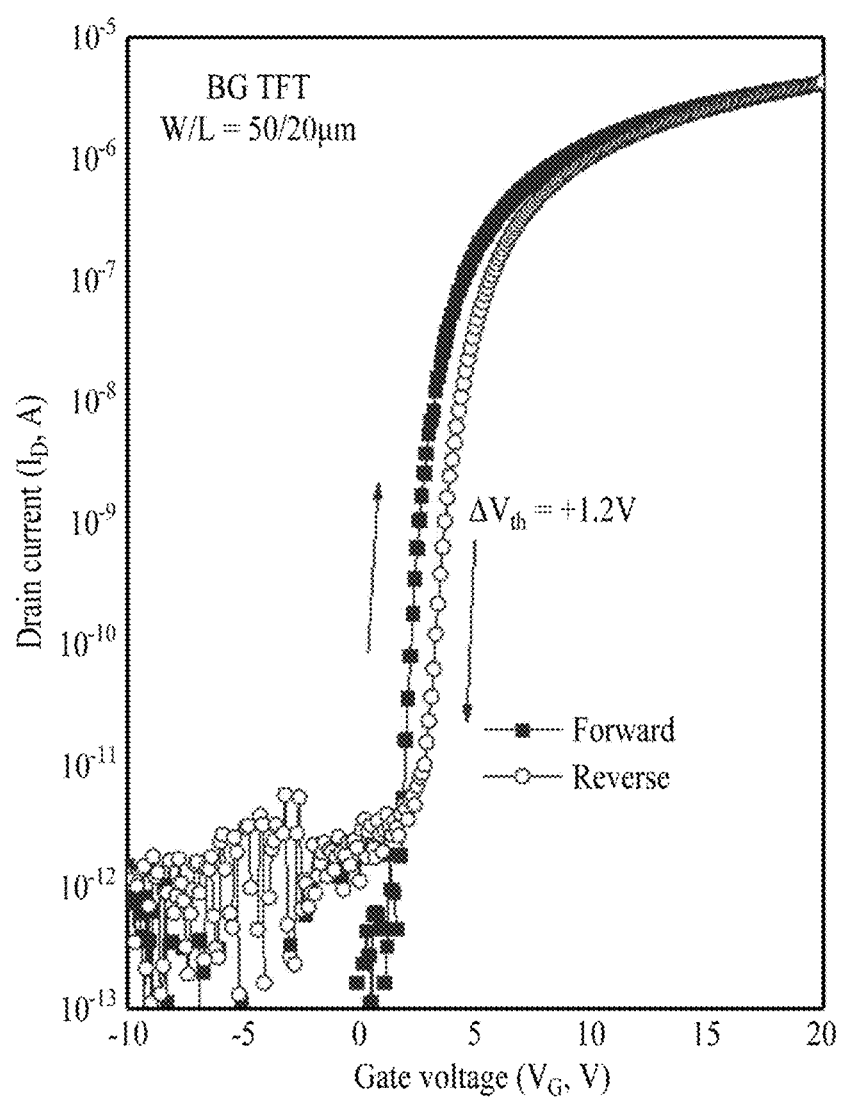
FIG. 19 is a graph illustrating a hysteresis behavior of a single-channel thin-film transistor (BG TFT) according to Comparative Example 2.
Figure 20:
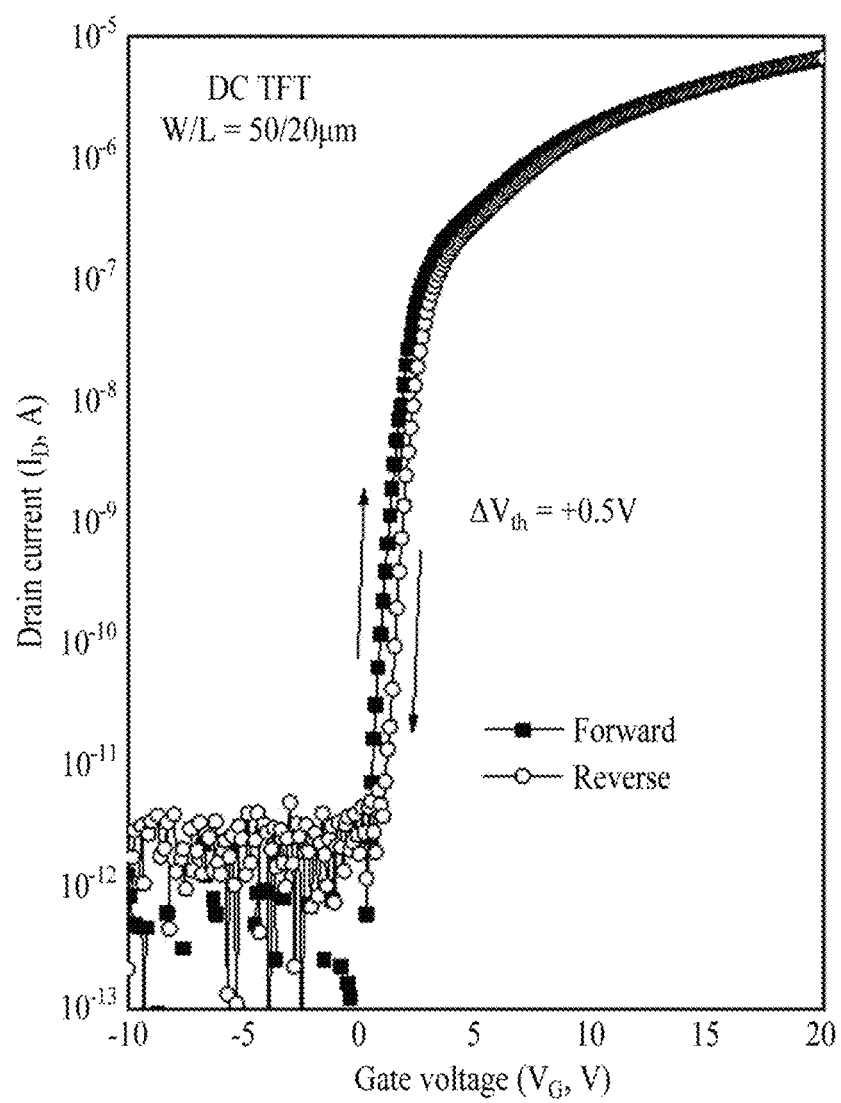
FIG. 20 is a graph illustrating a hysteresis behavior of a multilayer-channel thin-film transistor (DC TFT) according to one embodiment of the present invention.

FIG. 18 is a graph illustrating a hysteresis behavior of a single-channel thin-film transistor (TG TFT) according to Comparative Example 1, FIG. 19 is a graph illustrating a hysteresis behavior of a single-channel thin-film transistor (BG TFT) according to Comparative Example 2, and FIG. 20 is a graph illustrating a hysteresis behavior of a multilayer-channel thin-film transistor (DC TFT) according to one embodiment of the present invention.

In FIGS. 18 to 20, a channel width (W) is 50 μm, and a channel length (L) is 20 μm.

Referring to FIGS. 18 to 20, with regard to the operation voltage by a bias stress test, the multilayer-channel thin-film transistor (DC TFT) according to one embodiment of the present invention exhibits a reduced operation voltage mobility, compared to the single-channel thin-film transistor (TG TFT) according to Comparative Example 1 and the single-channel thin-film transistor (BG TFT) according to Comparative Example 2. From this result, it can be confirmed that the multilayer-channel thin-film transistor (DC TFT) according to one embodiment of the present invention has high reliability.

More specifically, the cause of the hysteresis characteristic may be the same as the movement principle of operation voltage in PBS and NBS. It can be confirmed that the multilayer-channel thin-film transistor (DC TFT) according to one embodiment of the present invention prevents the trapping of charges (electrons) at the interface between the channel layer (the first channel layer and the second channel layer) and the insulating layer (the first gate insulating film and the second gate insulating film), thereby exhibiting high reliability.

Although the present invention has been described through limited examples and figures, the present invention is not intended to be limited to the examples. Those skilled in the art will appreciate that various modifications, additions, and substitutions are possible, without departing from the scope and spirit of the invention. Therefore, the scope of the present invention should not be limited by the embodiments, but should be determined by the following claims and equivalents to the following claims.

DESCRIPTION OF SYMBOLS

100, 200: multilayer-channel thin-film transistor
101, 201: first multilayer-channel thin-film transistor
102, 202: second multilayer-channel thin-film transistor
103, 203: third multilayer-channel thin-film transistor
110, 210: substrate 120, 230: first channel layer
131, 221: first source electrode 132, 222: first drain electrode
141, 241: first gate insulating film 142, 242: second gate insulating film
150, 250: gate electrode 160, 260: second channel layer
171, 271: second source electrode 172, 272: second drain electrode

The invention claimed is:

1. A multilayer-channel thin-film transistor, comprising:
a first channel layer formed on a substrate;
a first source electrode and first drain electrode formed on the first channel layer;
a first gate insulating film formed on the first channel layer, the first source electrode and the first drain electrode;
a gate electrode formed on the first gate insulating film;
a second gate insulating film formed on the gate electrode;
a second channel layer formed on the second gate insulating film; and
a second source electrode and second drain electrode formed on the second channel layer,
wherein the first source electrode and the second source electrode are electrically connected to each other through a source electrode connection part, and the first drain electrode and the second drain electrode are electrically connected to each other through a drain electrode connection part, and
wherein the gate electrode is buried in the second gate insulating film.

2. The multilayer-channel thin-film transistor according to claim 1, wherein the first channel layer and second channel layer of the multilayer-channel thin-film transistor are simultaneously driven through the source electrode connection part and the drain electrode connection part.

3. The multilayer-channel thin-film transistor according to claim 1, wherein electrons injected into the first source electrode are collected in the first drain electrode through the first channel layer by the gate electrode, and
electrons injected into the second source electrode are collected in the second drain electrode through the second channel layer by the gate electrode.

4. The multilayer-channel thin-film transistor according to claim 1, wherein the source electrode connection part and the drain electrode connection part are formed to pass through the first gate insulating film and second gate insulating film.

5. The multilayer-channel thin-film transistor according to claim 1, wherein the first gate insulating film has a thickness of 10 nm to 300 nm.

6. The multilayer-channel thin-film transistor according to claim 1, wherein the first channel layer and the second channel layer comprise an n-type oxide semiconductor.

7. The multilayer-channel thin-film transistor according to claim 1, wherein at least two or more multilayer-channel thin-film transistors are laminated to have a three-dimensional structure.

8. The multilayer-channel thin-film transistor according to claim 7, wherein a second source electrode and second drain electrode of a lower multilayer-channel thin-film transistor of the multilayer-channel thin-film transistor having the three-dimensional structure are driven as a first source electrode and first drain electrode of an upper multilayer-channel thin-film transistor.

9. A multilayer-channel thin-film transistor, comprising:
a first source electrode and first drain electrode formed on a substrate;
a first channel layer formed on the substrate, the first source electrode and the second drain electrode;
a first gate insulating film formed on the first channel layer;
a gate electrode formed on the first gate insulating film;
a second gate insulating film formed on the gate electrode;
a second channel layer formed on the second gate insulating film; and
a second source electrode and second drain electrode formed on the second channel layer,
wherein the first source electrode and the second source electrode are electrically connected to each other through a source electrode connection part, and the first drain electrode and the second drain electrode are electrically connected to each other through a drain electrode connection part, and
wherein the gate electrode is buried in the second gate insulating film.

10. The multilayer-channel thin-film transistor according to claim 9, wherein the first channel layer and second channel layer of the multilayer-channel thin-film transistor are simultaneously driven through the source electrode connection part and the drain electrode connection part.

11. The multilayer-channel thin-film transistor according to claim 9, wherein electrons injected into the first source electrode are collected in the first drain electrode through the first channel layer by the gate electrode, and
electrons injected into the second source electrode are collected in the second drain electrode through the second channel layer by the gate electrode.

12. The multilayer-channel thin-film transistor according to claim 9, wherein at least two or more multilayer-channel thin-film transistors are laminated to have a three-dimensional structure.

13. The multilayer-channel thin-film transistor according to claim 12, wherein a second source electrode and second drain electrode of a lower multilayer-channel thin-film transistor of the multilayer-channel thin-film transistor having the three-dimensional structure are driven as a first source electrode and first drain electrode of an upper multilayer-channel thin-film transistor.

14. A method of fabricating a multilayer-channel thin-film transistor, the method comprising:
a step of forming a first channel layer on a substrate;
a step of forming a first source electrode and first drain electrode on the first channel layer;
a step of forming a first gate insulating film on the first channel layer, the first source electrode and the first drain electrode;
a step of forming a gate electrode on the first gate insulating film;
a step of forming a second gate insulating film on the first gate insulating film and the gate electrode;
a step of forming a second channel layer on the second gate insulating film;
a step of respectively forming a source electrode connection part and a drain electrode connection part on the first source electrode and the first drain electrode;
a step of forming a second source electrode on the second channel layer to be connected to the source electrode connection part; and
a step of forming a second drain electrode on the second channel layer to be connected to the drain electrode connection part, and
wherein the gate electrode is buried in the second gate insulating film.

15. The multilayer-channel thin-film transistor according to claim 14, wherein the step of respectively forming a source electrode connection part and a drain electrode connection part on the first source electrode and the first drain electrode comprises:
a step of forming a first via hole on the first gate insulating film and second gate insulating film formed on the first source electrode;
a step of forming a second via hole on the first gate insulating film and second gate insulating film formed on the first drain electrode; and
a step of respectively forming a source electrode connection part and a drain electrode connection part inside the first via hole and the second via hole.

16. A method of fabricating a multilayer-channel thin-film transistor, the method comprising:
a step of forming a first source electrode and first drain electrode on a substrate;
a step of forming a first channel layer on the substrate, the first source electrode and the first drain electrode;
a step of forming a first gate insulating film on the first channel layer;
a step of forming a gate electrode on the first gate insulating film;
a step of forming a second gate insulating film on the first gate insulating film and the gate electrode;
a step of forming a second channel layer on the second gate insulating film;
a step of respectively forming a source electrode connection part and a drain electrode connection part on the first source electrode and the first drain electrode;

a step of forming a second source electrode on the second channel layer to be connected to the source electrode connection part; and a step of forming a second drain electrode on the second channel layer to be connected to the drain electrode connection part, and wherein the gate electrode is buried in the second gate insulating film.

17. The multilayer-channel thin-film transistor according to claim 16, wherein the step of respectively forming a source electrode connection part and a drain electrode connection part on the first source electrode and the first drain electrode comprises:

a step of forming a first via hole on the first gate insulating film and second gate insulating film formed on the first source electrode;

a step of forming a second via hole on the first gate insulating film and second gate insulating film formed on the first drain electrode; and a step of respectively forming a source electrode connection part and a drain electrode connection part inside the first via hole and the second via hole.

* * * * *